US009793512B2

(12) United States Patent
Choi et al.

(10) Patent No.: US 9,793,512 B2
(45) Date of Patent: Oct. 17, 2017

(54) DISPLAY DEVICE

(71) Applicant: SAMSUNG DISPLAY CO., LTD., Yongin-si, Gyeonggi-do (KR)

(72) Inventors: Yoonsun Choi, Yongin-si (KR); Mugyeom Kim, Yongin-si (KR); Sangjo Lee, Yongin-si (KR); Wonsuk Choi, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 15/250,613

(22) Filed: Aug. 29, 2016

(65) Prior Publication Data

US 2017/0271616 A1    Sep. 21, 2017

(30) Foreign Application Priority Data

Mar. 21, 2016    (KR) .......................... 10-2016-0033378

(51) Int. Cl.
*H01L 51/52*    (2006.01)
*H01L 27/32*    (2006.01)

(52) U.S. Cl.
CPC ...... *H01L 51/5253* (2013.01); *H01L 27/3272* (2013.01); *H01L 51/529* (2013.01); *H01L 2251/5338* (2013.01)

(58) Field of Classification Search
CPC ............ G06F 1/1652; G06F 1/133305; G06F 2203/04102; H01L 2251/5338;

(Continued)

(56) References Cited

U.S. PATENT DOCUMENTS

2003/0134488 A1    7/2003    Yamazaki et al.
2014/0042406 A1    2/2014    Degner et al.
(Continued)

FOREIGN PATENT DOCUMENTS

KR    10-2013-0076402 A    7/2013
KR    10-2014-0085956 A    7/2014
(Continued)

OTHER PUBLICATIONS

EPO Extended Search Report dated Jul. 10, 2017, for corresponding European Patent Application No. 16204524.9 (9 pages).

*Primary Examiner* — Tucker J Wright
(74) *Attorney, Agent, or Firm* — Lewis Roca Rothgerber Christie LLP

(57) ABSTRACT

A display device includes a substrate including a bending area between a first region and a second region and configured to be bent at the bending area, a display portion above the substrate in the first region, a protective film below the substrate and including a protective film base and an adhesive layer, wherein the protective film base has an opening corresponding to the bending area or the protective film base corresponds to at least a portion of the first region, and wherein the adhesive layer is between the substrate and the protective film base and forms an integral body above the first region, the bending area, and the second region, and at least a portion of the adhesive layer that corresponds to the bending area has a hardness different from that of at least a portion of the adhesive layer corresponding to the first region.

21 Claims, 14 Drawing Sheets

(58) Field of Classification Search
CPC ............. H01L 51/0097; H01L 51/5253; H01L 51/529; H01L 27/3244; H01L 27/5246; H01L 27/3272; G09F 9/301; B32B 7/12; B32B 7/02; B32B 37/12; B32B 37/14
See application file for complete search history.

(56) References Cited

U.S. PATENT DOCUMENTS

| | | |
|---|---|---|
| 2015/0036300 A1 | 2/2015 | Park et al. |
| 2015/0144913 A1 | 5/2015 | Shim |
| 2016/0043337 A1 | 2/2016 | Namkung et al. |
| 2016/0093683 A1 | 3/2016 | Lee et al. |
| 2016/0099433 A1 | 4/2016 | Prushinskiy et al. |
| 2017/0047547 A1* | 2/2017 | Son ..................... H01L 51/5253 |
| 2017/0080680 A1* | 3/2017 | Lee .......................... B32B 7/02 |

FOREIGN PATENT DOCUMENTS

| | | |
|---|---|---|
| KR | 10-2015-0007632 A | 1/2015 |
| KR | 10-2015-0014713 A | 2/2015 |

\* cited by examiner

DISPLAY DEVICE

CROSS-REFERENCE TO RELATED APPLICATION

This application claims priority to and the benefit of Korean Patent Application No. 10-2016-0033378, filed on Mar. 21, 2016, in the Korean Intellectual Property Office, the disclosure of which is incorporated herein in its entirety by reference.

BACKGROUND

1. Field

Aspects of the present invention relate to a display device.

2. Description of the Related Art

Generally, a display device includes a display portion over a substrate. The display device may improve visibility at various angles or reduce the area of a non-display area by bending at least a portion thereof.

However, in a conventional display device, a defect occurs during a process of manufacturing a bent display device or the life of the display device reduces or excessive manufacturing costs are incurred.

SUMMARY

Aspects of one or more embodiments are directed to a display device that may reduce a defect rate during a manufacturing process while reducing manufacturing costs. However, this feature is merely exemplary and the scope of the inventive concept is not limited by this.

Additional aspects will be set forth in part in the description which follows and, in part, will be apparent from the description, or may be learned by practice of the presented embodiments.

According to one or more embodiments, there is provided a display device including: a substrate including a bending area between a first region and a second region and configured to be bent at the bending area; a display portion above the substrate in the first region; a protective film below the substrate and including a protective film base and an adhesive layer, wherein the protective film base has an opening corresponding to the bending area, the protective film base corresponding to at least a portion of the first region, and wherein the adhesive layer is between the substrate and the protective film base and forms an integral body above the first region, the bending area, and the second region, and at least a portion of the adhesive layer that corresponds to the bending area has a hardness different from that of at least a portion of the adhesive layer corresponding to the first region.

In an embodiment, the at least a portion of the adhesive layer that corresponds to the bending area has greater hardness than that of the at least a portion of the adhesive layer corresponding to the first region.

In an embodiment, the adhesive layer includes a portion having decreasing hardness or a portion having increasing adhesive force in a direction from a center of the bending area to a center of the first region along the adhesive layer.

In an embodiment, a portion of the adhesive layer corresponding to the second region has a same hardness as that of a portion of the adhesive layer corresponding to the bending area.

In an embodiment, a portion of the adhesive layer corresponding to the bending area and the second region has greater hardness than that of the at least a portion of the adhesive layer corresponding to the first region.

In an embodiment, the adhesive layer includes a portion having decreasing hardness or a portion having increasing adhesive force in a direction from a center of the bending area to a center of the first region along the adhesive layer.

In an embodiment, the display device further includes a light-shielding layer below a portion of the protective film base corresponding to the display portion, the light-shielding layer corresponding to at least a portion of the display portion.

In an embodiment, the light-shielding layer is configured to shield against ultraviolet rays.

In an embodiment, the substrate is configured to be bent such that a portion of a lower surface thereof in the first region faces at least a portion of a lower surface thereof in the second region, the protective film base corresponds to the first and second regions and has an opening corresponding to the bending area, and the light-shielding layer contacts both a portion of the protective film base corresponding to the first region and a portion of the protective film base corresponding to the second region.

In an embodiment, the substrate is configured to be bent such that a portion of a lower surface thereof in the first region faces at least a portion of a lower surface thereof in the second region, the protective film base is below the substrate corresponding to at least a portion of the first region, and the light-shielding layer contacts a portion of the protective film base corresponding to the first region and a portion of the adhesive layer corresponding to the second region.

In an embodiment, the display device further includes a heat-insulating layer below a portion of the protective film base corresponding to the display portion, the heat-insulating layer corresponding to at least a portion of the display portion.

In an embodiment, the substrate is configured to be bent such that a portion of a lower surface thereof in the first region faces at least a portion of a lower surface thereof in the second region, the protective film base corresponds to the first and second regions and has an opening corresponding to the bending area, and the heat-insulating layer contacts both a portion of the protective film base corresponding to the first region and a portion of the protective film base corresponding to the second region.

In an embodiment, the substrate is configured to be bent such that a portion of a lower surface thereof in the first region faces at least a portion of a lower surface thereof in the second region, the protective film base is below a portion of the substrate to correspond to at least a portion of the first region, and the heat-insulating layer contacts a portion of the protective film base corresponding to the first region and a portion of the adhesive layer corresponding to the second region.

According to one or more embodiments, there is provided a display device including: a substrate including a first region, a second region, and a bending region between the first region and the second region, the substrate being bent at the bending region and supporting a display portion above the first region; and a protective film below the substrate and including a protective film base covering at least a portion of the first region, and further including an adhesive layer covering the bending region and the first and second regions, a first portion of the adhesive layer corresponding to the first region having a hardness different from that of a second portion of the adhesive layer corresponding to the bending region.

In an embodiment, the protective film base covers a portion of the second region facing the first region, when the substrate is bent, and does not cover the bending region.

In an embodiment, the adhesive layer is locally hardened through exposure to UV radiation, and, as a result of exposure to the UV radiation, the second portion of the adhesive layer has a greater hardness than that of the first portion of the adhesive layer and a third portion of the adhesive layer corresponding to the second region.

In an embodiment, the display device further includes a heat-insulating layer covering a portion of the protective film base corresponding to the first region and the second region.

In an embodiment, the display device further includes a light-shielding layer covering a portion of the protective film base corresponding to the first region, the light-shielding layer being configured to reduce exposure to UV radiation at a first portion of the adhesive layer relative to the second portion of the adhesive layer.

According to an embodiment, a display device which may reduce a defect rate during a manufacturing process while reducing manufacturing costs may be implemented. As understood by a person of ordinary skill in the art, the scope of the inventive concept is not limited by this effect.

BRIEF DESCRIPTION OF THE DRAWINGS

These and/or other aspects will become apparent and more readily appreciated from the following description of the embodiments of the inventive concept, taken in conjunction with the accompanying drawings in which.

DETAILED DESCRIPTION

Figure 1:
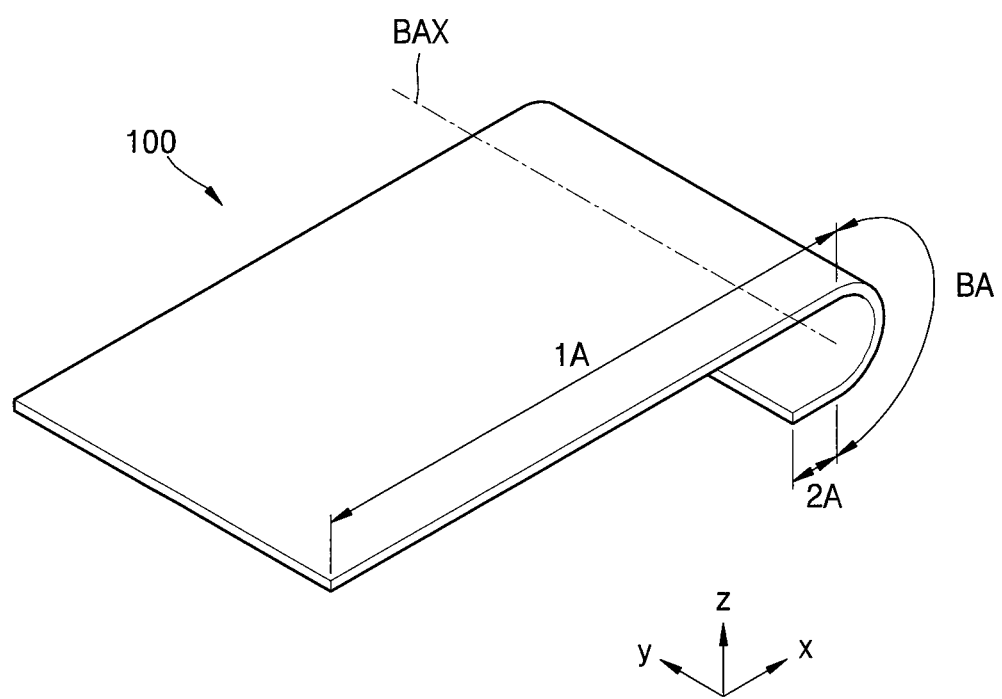
FIG. 1 is a perspective view illustrating a portion of a display device according to an embodiment of the inventive concept.

As the inventive concept allows for various changes and numerous embodiments, exemplary embodiments will be illustrated in the drawings and described in detail in the written description. An effect and a characteristic of the inventive concept, and a method of accomplishing these will be apparent when referring to embodiments described with reference to the drawings. This inventive concept may, however, be embodied in many different forms and should not be construed as limited to the exemplary embodiments set forth herein.

Hereinafter, the inventive concept will be described more fully with reference to the accompanying drawings, in which exemplary embodiments of the inventive concept are shown. When description is made with reference to the drawings, like reference numerals in the drawings denote like or corresponding elements, and repeated description thereof will be omitted.

FIG. 1 is a perspective view illustrating a portion of a display device according to an embodiment of the inventive concept. In the display device according to an embodiment, as illustrated in FIG. 1, a portion of a substrate 100, which is a portion of the display device, is bent and thus a portion of the display device has a bent shape like the substrate 100.

As illustrated in FIG. 1, the substrate 100 of the display device according to an embodiment includes a bending area BA extending in a first direction (e.g., the +y direction). The bending area BA is located between a first region 1A and a second region 2A along a second direction (e.g., the +x direction) crossing the first direction. Also, the substrate 100 is bent around a bending axis BAX extending in the first direction (e.g., the +y direction) as illustrated in FIG. 1. The substrate 100 may include various suitable materials having a flexible or bendable characteristic, and include, for example, a polymer resin such as polyethersulphone (PES), polyacrylate (PAR), polyetherimide (PEI), polyethylene naphthalate (PEN), polyethylene terephthalate (PET), polyphenylene sulfide (PPS), polyarylate, polyimide (PI), polycarbonate (PC), cellulose acetate propionate (CAP), and/or the like.

FIGS. 2 to 7 are cross-sectional views illustrating processes of manufacturing the display device of FIG. 1.

Figure 2:
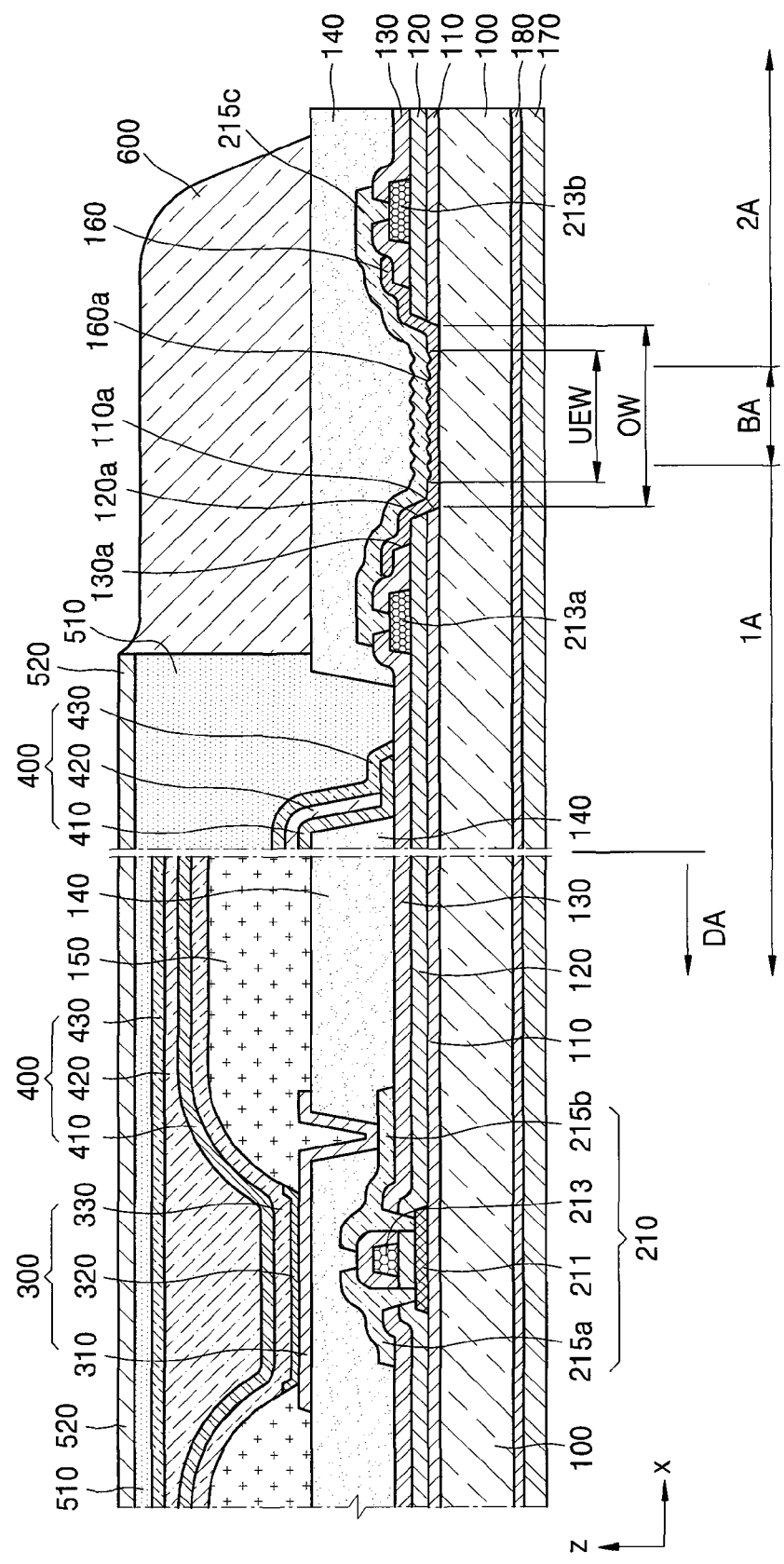
FIGS. 2 to 7 are cross-sectional views illustrating processes of manufacturing the display device of FIG. 1.

First, a display panel illustrated in FIG. 2 is prepared. As illustrated in FIG. 2, the first region 1A of the substrate 100 includes a display area DA. The first region 1A includes a portion of a non-display area outside the display area DA in addition to the display area DA as illustrated in FIG. 2. Also, the second region 2A includes the non-display area. A display portion may be in the first region 1A. The display portion may include a display element such as an organic light-emitting diode (OLED) 300, a thin film transistor (TFT) 210, and/or the like. The display portion may include only elements disposed inside the display area DA and include elements belonging to the first region 1A and disposed inside the non-display area. The substrate 100 includes the bending area BA between the first region 1A and the second region 2A. The substrate 100 is bent in the bending area BA afterward and has a shape illustrated in FIG. 1.

The display panel includes a protective film base 170 below a lower surface of the display panel, which is a surface in a direction (e.g., the −z direction) opposite to a direction (e.g., the +z direction) in which the display portion of the substrate 100 is located. The protective film base 170 may be attached below the lower surface of the substrate 100 by using an adhesive layer 180. That is, a protective film is attached on the lower surface of the substrate 100, the protective film including the protective film base 170 and the adhesive layer 180.

A detailed configuration of the display panel on which the protective film has been attached is described with reference to FIG. 2.

In addition to a display element such as the OLED 300, a TFT 210 may also be in the display area DA of the display panel as described herein and be electrically connected to the OLED 300. A configuration in which an OLED is electrically connected to the TFT 210 may be understood as a configuration in which a pixel electrode 310 is electrically connected to the TFT 210. A TFT may also be in a circumferential region outside the display area DA of the substrate 100 when suitable. The TFT in the circumferential region may be a portion of a circuit portion for controlling an electric signal applied to the display area DA, for example.

The TFT 210 may include a semiconductor layer 211, a gate electrode 213, a source electrode 215a, and a drain electrode 215b including amorphous silicon, polycrystalline silicon, or an organic semiconductor material. To secure insulation between the semiconductor layer 211 and the gate electrode 213, a gate insulating layer 120 may be between the semiconductor layer 211 and the gate electrode 213. The gate insulating layer 120 includes an inorganic material such as silicon oxide, silicon nitride, silicon oxynitride, and/or the like. Also, an interlayer insulating layer 130 may be positioned over the gate electrode 213, the interlayer insulating layer 130 including an inorganic material such as silicon oxide, silicon nitride, silicon oxynitride, and/or the like. The source electrode 215a and the drain electrode 215b may be over (e.g., be above and overlapping with) the interlayer insulating layer 130. The insulating layer including an inorganic material may be formed by chemical vapor deposition (CVD) or atomic layer deposition (ALD). The same or substantially the same is applied to embodiments described below and modified embodiments thereof.

A buffer layer 110 may be between the TFT 210 having the over structure and the substrate 100. The buffer layer 110 may include an inorganic material such as silicon oxide, silicon nitride, silicon oxynitride, and/or the like. The buffer layer 110 may increase a planarization characteristic of the upper surface of the substrate 100, or prevent or minimize penetration of impurities from the substrate 100, for example, into the semiconductor layer 211 of the TFT 210.

Also, a planarization layer 140 may be over (e.g., be above and overlapping with) the TFT 210. For example, as illustrated in FIG. 2, in the case where an OLED is over (e.g., is above and overlapping with) the TFT 210, the planarization layer 140 may substantially planarize the upper portion of a protective layer covering the TFT 210. The planarization layer 140 may include an organic material such as acryl, benzocyclobutene (BCB), hexamethyldisiloxane (HMDSO), and/or the like. Although FIG. 2 illustrates the planarization layer 140 as a single layer, the planarization layer 140 may have several layers and may be variously modified as suitable. Also, as illustrated in FIG. 2, the planarization layer 140 includes an opening outside the display area DA to physically separate a portion of the planarization layer 140 in the display area DA from a portion of the planarization layer 140 in the second region 2A. This is for preventing or substantially preventing external impurities from reaching the display area DA via the planarization layer 140.

In the display area DA, the OLED 300 may be over (e.g., be above and overlapping with) the planarization layer 140, the OLED 300 including the pixel electrode 310, an opposite electrode 330, and an intermediate layer 320 between the pixel electrode 310 and the opposite electrode 330 and including an emission layer. The pixel electrode 310 is electrically connected to the TFT 210 by contacting one of the source electrode 215a and the drain electrode 215b via an opening formed in the planarization layer 140 as illustrated in FIG. 2.

A pixel-defining layer 150 may be over (e.g., be above and overlapping with) the planarization layer 140. The pixel-defining layer 150 defines a pixel by including an opening corresponding to sub-pixels, that is, an opening exposing at least the central portion of the pixel electrode 310. Also, in the case illustrated in FIG. 2, the pixel-defining layer 150 prevents or substantially prevents arc, and/or the like from occurring at the edge of the pixel electrode 310 by increasing a distance between the edge of the pixel electrode 310 and the opposite electrode 330 over the pixel electrode 310. The pixel-defining layer 150 may include an organic material such as PI, HMDSO, and/or the like.

The intermediate layer 320 of the OLED 300 may include a low molecular material or a polymer material. In the case where the intermediate layer 320 includes a low molecular material, the intermediate layer 320 may have a structure in which a hole injection layer (HIL), a hole transport layer (HTL), an emission layer (EML), an electron transport layer (ETL), an electron injection layer (EIL), and/or the like are stacked in a single or composite structure. The intermediate layer 320 may include various suitable organic materials such as copper phthalocyanine (CuPc), N,N'-Di(naphthalene-1-yl)-N,N'-diphenyl-benzidine (NPB), tris-8-hydroxyquinoline aluminum (Alq3), and/or the like. These layers may be formed by a vacuum deposition method.

In the case where the intermediate layer 320 includes a polymer material, the intermediate layer 320 may have a structure including an HTL and an EML. In this case, the HTL may include a poly(3,4-ethylenedioxythiophene (PEDOT), and the EML may include a polymer material such as a poly-phenylenevinylene (PPV)-based material, a polyfluorene-based material, and/or the like. The intermediate layer 320 may be formed by screen printing, inkjet printing, laser induced thermal imaging (LITI), and/or the like.

As understood by a person of ordinary skill in the art, the intermediate layer 320 is not necessarily limited thereto and may have various suitable structures. Also, the intermediate layer 320 may include a layer integrally formed over a plurality of pixel electrodes 310 and include a layer patterned to correspond to the plurality of pixel electrodes 310.

The opposite electrode 330 is over (e.g., is above and overlapping with) the display area DA and may cover the display area DA as illustrated in FIG. 2. That is, the opposite electrode 330 may be integrally formed over a plurality of OLEDs and may correspond to the plurality of pixel electrodes 310.

Because the OLED may be easily damaged by external moisture, oxygen, and/or the like, an encapsulation layer 400 may protect the OLEDs by covering the OLEDs. The encapsulation layer 400 may cover the display area DA and extend up to the outer side of the display area DA. As illustrated in FIG. 2, the encapsulation layer 400 may include a first inorganic encapsulation layer 410, an organic encapsulation layer 420, and a second inorganic encapsulation layer 430.

The first inorganic encapsulation layer 410 may cover the opposite electrode 330 and include silicon oxide, silicon nitride, silicon oxynitride, and/or the like. Other layers such as a capping layer, and/or the like may be between the first inorganic encapsulation layer 410 and the opposite electrode 330 when suitable. Because the first inorganic encapsulation layer 410 is formed along a structure therebelow, the upper surface of the first inorganic encapsulation layer 410 is not planarized as illustrated in FIG. 2. The organic encapsulation layer 420 may cover the first inorganic encapsulation layer 410. Unlike the first inorganic encapsulation layer 410, the upper surface of the organic encapsulation layer 420 may be planarized. For example, the upper surface of the organic encapsulation layer 420 may be approximately planarized in a portion corresponding to the display area DA. The organic encapsulation layer 420 may include at least one of PET, PEN, PC, PI, polyethylenesulphonate, polyoxymethylene (POM), polyacrylate (PAR), hexamethyldisiloxane, and/or the like. The second inorganic encapsulation layer 430 may cover the organic encapsulation layer 420 and include silicon oxide, silicon nitride, silicon oxynitride, and/or the like. The second inorganic encapsulation layer 430 may not expose the organic encapsulation layer 420 to the outside by contacting the edge of the first inorganic encapsulation layer 410 outside the display area DA.

Because the encapsulation layer 400 includes the first inorganic encapsulation layer 410, the organic encapsulation layer 420, and the second inorganic encapsulation layer 430, even when a crack occurs inside the encapsulation layer 400, the crack may not be allowed to be connected between the first inorganic encapsulation layer 410 and the organic encapsulation layer 420 or between the organic encapsulation layer 420 and the second inorganic encapsulation layer 430 via the herein-described multi-layered structure. Thus, forming of a path via which external moisture, oxygen, and/or the like penetrates into the display area DA may be prevented or minimized.

A process of forming a touch electrode of various suitable patterns for a touchscreen function, or a touch protective layer for protecting the touch electrode over the encapsulation layer 400 may be further performed when suitable.

The display panel includes a protective film below the lower surface of the display panel, which is a surface in the direction (e.g., the −z direction) opposite to the direction (e.g., the +z direction) in which the display portion of the substrate 100 is located. The protective film base 170 of the protective film may include PET, PI, and/or the like. As described herein, the protective film base 170 may be attached below the lower surface of the substrate 100 by using the adhesive layer 180. The adhesive layer 180 of the protective film may include, for example, a pressure sensitive adhesive (PSA). A time point at which the protective film is attached on the lower surface of the substrate 100 may change depending on circumstances.

For example, in the case of forming a plurality of display portions in one mother substrate, a hard carrier substrate may be below the mother substrate in order to facilitate handling the mother substrate having a flexible or bendable characteristic during a manufacturing process. With the mother substrate supported by the carrier substrate, the plurality of display portions and the encapsulation layer 400 encapsulating the plurality of display portions are formed over the mother substrate. Each of the plurality of display portions includes a display element, such as the OLED 300, the TFT 210, and/or the like as described herein. After the plurality of display portions are formed over the mother substrate, the carrier substrate may be separated from the mother substrate. After a touch electrode and/or a touch protective layer for protecting the touch electrode, and/or the like are formed over the encapsulation layer 400, the carrier substrate may be separated from the mother substrate. In any case, after the carrier substrate is separated from the mother substrate, a plurality of display panels may be obtained by attaching the protective film including the protective film base 170 and the adhesive layer 180 below a surface in a direction of the carrier substrate of the mother substrate, and then cutting the mother substrate and the protective film. The substrate 100 may be understood as the mother substrate that has been cut in this fashion.

After the plurality of display panels are obtained by cutting the mother substrate and the protective film, a polarization plate 520 may be attached over the encapsulation layer 400 by using an optically clear adhesive (OCA) 510, and a printed circuit board, an electronic chip, and/or the like may be attached in the second region 2A when suitable. When a touch electrode or a touch protective layer is over (e.g., is above and overlapping with) the encapsulation layer 400, the OCA 510 and the polarization plate 520 are located over these elements. Also, a bending protection layer (BPL) 600 may be formed outside the display area DA.

The plurality of display panels may not be obtained concurrently (e.g., simultaneously) by using the mother substrate, and one display portion may be formed over one substrate 100. Even in this case, a hard carrier substrate may be below the substrate 100 in order to facilitate handling of the substrate 100 having a flexible or bendable characteristic during a manufacturing process. After a display portion including a display element such as the OLED 300, the TFT 210, and/or the like, and the encapsulation layers 400 encapsulating the display portion are formed over the substrate 100, the carrier substrate may be separated from the substrate 100. After a touch electrode, a touch protective layer, and/or the like for protecting the touch electrode are formed over the encapsulation layer 400, the carrier substrate may be separated from the substrate 100. In any case, after the carrier substrate is separated from the mother substrate, the protective film may be attached below a surface in a direction of the carrier substrate of the substrate 100, the protective film including the protective film base 170 and the adhesive layer 180. After that, the polarization plate 520 may be attached over the encapsulation layer 400 or the touch protective layer by using the OCA 510, and a printed circuit board, an electronic chip, and/or the like may be attached in the second region 2A when suitable. Also, the BPL 600 may be formed outside the display area DA.

The polarization plate 520 may reduce external light reflection. For example, in the case where external light passes through the polarization plate 520, and is reflected by the upper surface of the opposite electrode 330, and then passes through the polarization plate 520 again, because the external light passes through the polarization plate 520 twice, the phase of the external light may be allowed to change. As a result, destructive interference may occur by allowing the phase of the reflected light to be different from the phase of the external light entering the polarization plate 520, and thus, visibility may improve by reducing the external light reflection. The OCA 510 and the polarization plate 520 may cover an opening of the planarization layer 140 as illustrated in FIG. 2.

The forming of the polarization plate 520 is not always performed when manufacturing the display device according to an embodiment, and other elements may replace the polarization plate 520 when suitable. For example, the polarization plate 520 may not be attached and a black matrix and a color filter may be formed, so that external light may be reduced in the display device completed afterward.

The BPL 600 may be over (e.g., be above and overlapping with) a first conductive layer 215c and may correspond to at least the bending area BA. When a certain stacked body is bent, a stress neutral plane exists inside the stacked body. When the BPL 600 is omitted, excessive tensile stress, and/or the like may be applied to the first conductive layer 215c inside the bending area BA when the substrate 100, and/or the like are bent as described below. This is because the location of the first conductive layer 215c may not correspond to the stress neutral plane. However, the location of the stress neutral plane may be adjusted in a stacked body including all of the substrate 100, the first conductive layer 215c, the BPL 600, and/or the like by forming the BPL 600 and adjusting a thickness, a modulus thereof, and/or the like. Therefore, a bending portion may be protected by allowing the stress neutral plane to be located in the neighborhood of the first conductive layer 215c via the BPL 600, thus reducing or minimizing tensile stress applied to the first conductive layer 215c.

Unlike FIG. 2, the BPL 600 may extend up to the end of the edge of the substrate 100 of the display device. For example, at least a portion of the first conductive layer 215c, a second conductive layer 213b, other conductive layers, and/or the like electrically connected to these layers may not be covered with the interlayer insulating layer 130, the planarization layer 140, and/or the like and may be electrically connected to various suitable electronic devices, a printed circuit board, and/or the like. Accordingly, portions via which the first conductive layer 215c, the second conductive layer 213b, and/or other conductive layers electrically connected to these layers are electrically connected to the various suitable electronic devices, the printed circuit board, and/or the like exist. In this case, it may be desirable for the electrically connected portion to be protected from impurities such as external moisture, and the BPL 600 may cover even the electrically connected portions, thus also serve as a protective layer. For this purpose, the BPL 600 may extend, for example, up to the end of the edge of the substrate 100 of the display device.

Although FIG. 2 illustrates that the upper surface of the BPL 600 extending in a display area direction (e.g., the −x direction) coincides with (e.g., meets and aligns at an edge with) the upper surface (e.g., the +z direction) of the polarization plate 520, the inventive concept is not limited thereto. For example, the end of the BPL 600 in the display area direction (e.g., the −x direction) may cover an edge portion of the upper surface of the polarization plate 520. In some examples, the end of the BPL 600 in the display area direction (e.g., the −x direction) may not contact the polarization plate 520 and/or the OCA 510.

Figure 3:
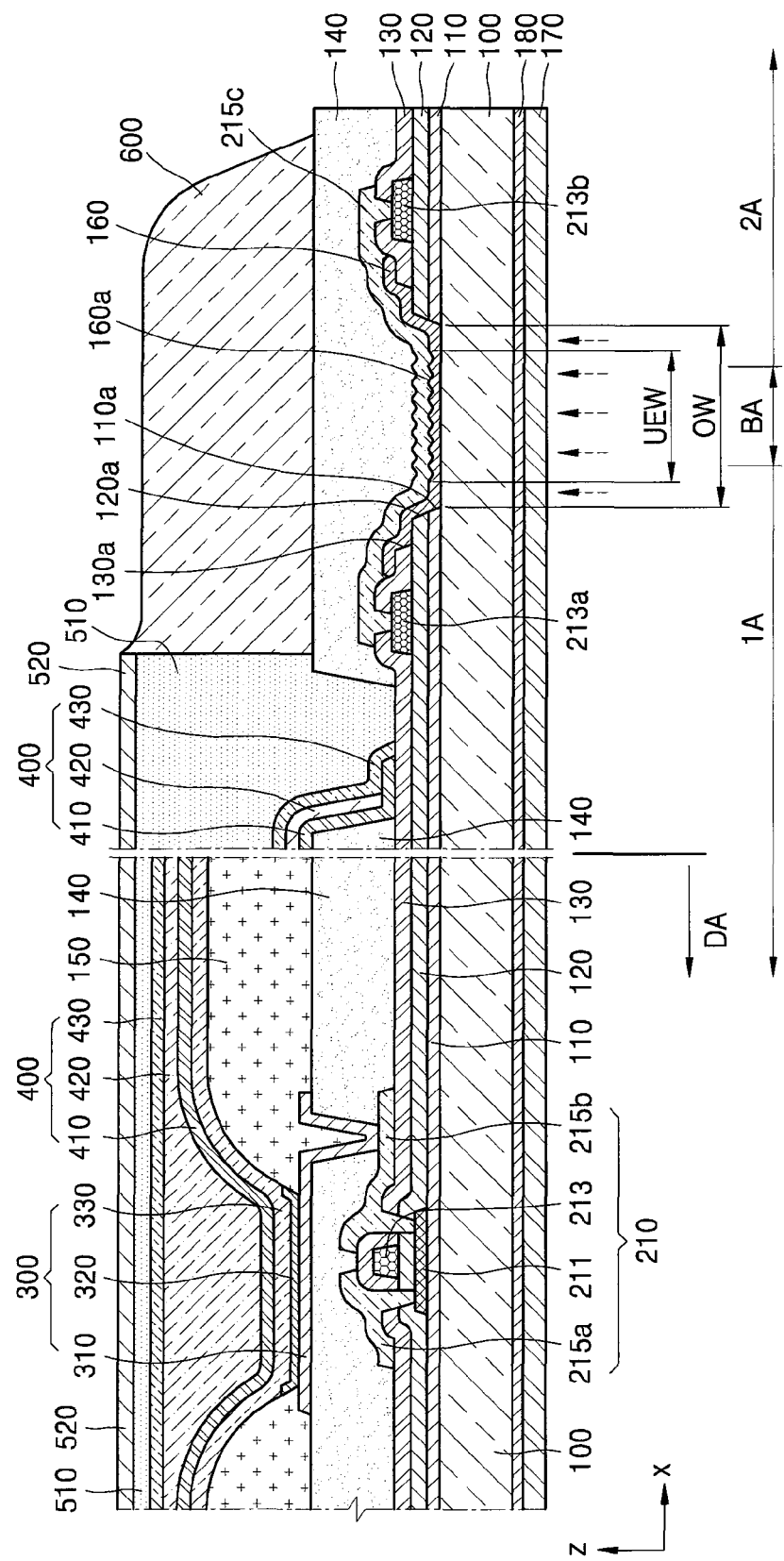
Figure 4:
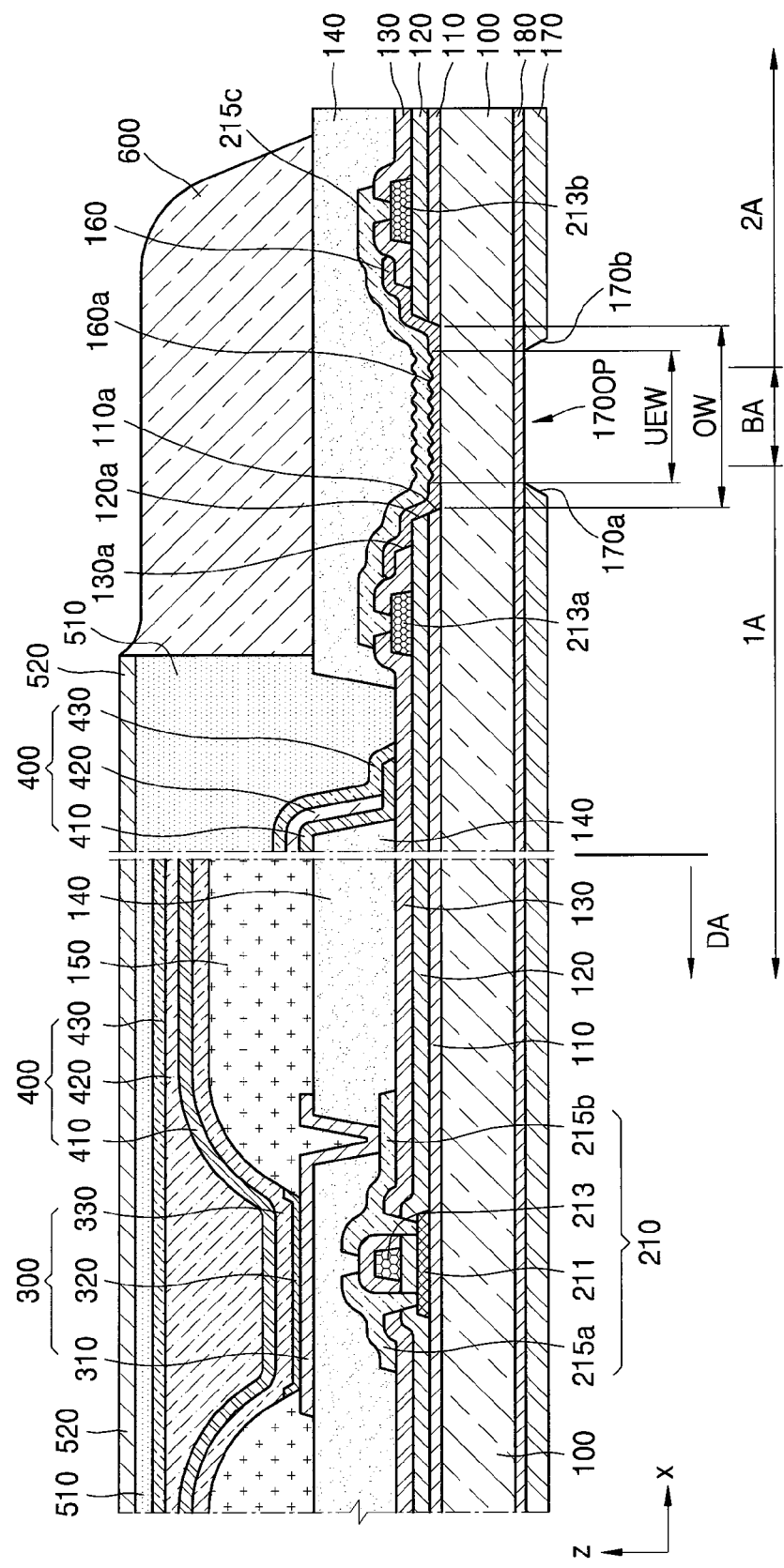

After the protective film including the protective film base 170 and the adhesive layer 180 is attached below the substrate 100, the protective film base 170 is allowed to include an opening 1700P corresponding to the bending area BA as illustrated in FIG. 4 by irradiating a laser beam to a portion of the protective film base 170 that corresponds to the bending area BA as illustrated in FIG. 3. FIG. 3 illustrates that the laser beam is irradiated onto a portion of the protective film base 170 that corresponds to a portion of an organic layer 160 in which an irregular surface 160a is formed as described below.

A method of removing a portion of the protective film base 170 of the protective film is not limited thereto. For example, before the protective film is attached below the substrate 100, at least a portion of the protective film base 170 that corresponds to a boundary between a portion of the protective film base 170 to be removed and a portion of the protective film base 170 not to be removed may be cut in advance. Here, the portion of the protective film base 170 to be removed may be understood as a portion of the protective film base 170 that corresponds to at least the bending area BA while the protective film is attached below the substrate 100. After the protective film is attached below the substrate 100, the portion of the protective film base 170 that corresponds to at least the bending area BA may be removed. In this case, to easily remove the portion of the protective film base 170 that corresponds to at least the bending area BA, the adhesive force of a portion of the adhesive layer 180 that corresponds to the portion of the protective film base 170 that corresponds to at least the bending area BA may be allowed to be less than the adhesive force of the other portion of the adhesive layer 180. That is, the adhesive force of the portion of the adhesive layer 180 of the protective film that corresponds to at least the bending area BA may be less than the adhesive force of the other portion of the adhesive layer 180.

When forming the opening 1700P by removing a portion of the protective film base 170 using various suitable methods, the inner surfaces 170a and 170b of the opening 1700P may have a shape inclined with respect to the lower surface of the substrate 100. The opening 1700P may have a shape extending in the first direction (e.g., the +y direction). After forming the opening 1700P in the protective film base 170 as illustrated in FIG. 4, the display panel may be allowed to have the shape illustrated in FIG. 1 as a whole by bending the substrate 100, and/or the like in the bending area BA.

Figure 5:
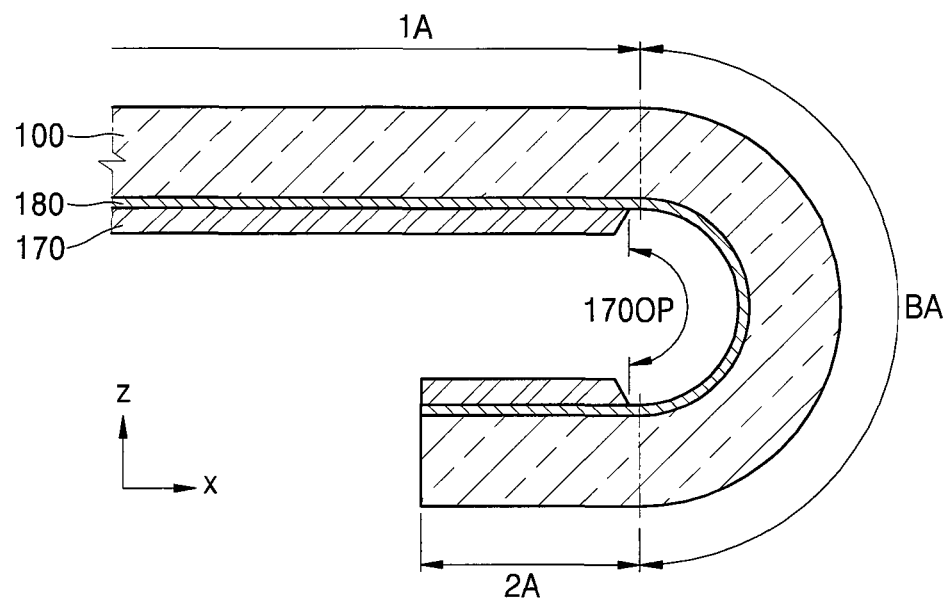

FIG. 5 is a cross-sectional view illustrating a portion of the display device of FIG. 1, for example, the substrate 100 and the protective film. As illustrated in FIG. 5, the substrate 100 may be bent in the bending area BA. Because the protective film base 170 of the protective film has a function of protecting the lower surface of the substrate 100, the protective film base 170 may have itself strength. Accordingly, if the protective film base 170 has low flexibility, when the substrate 100 is bent, exfoliation may occur between the protective film base 170 and the substrate 100. However, in the display device according to an embodiment, because the protective film base 170 includes the opening 1700P corresponding to the bending area BA, the occurrence of the exfoliation may be effectively prevented or reduced.

Particularly, in the display device according to an embodiment, the inner surfaces 170a and 170b of the opening 1700P of the protective film base 170 have a shape inclined with respect to the lower surface of the substrate 100. Accordingly, the thickness of a portion of the protective film base 170 that is adjacent to the opening 1700P reduces toward the opening 1700P. Accordingly, even when the substrate 100 is bent in the bending area BA and stress occurs at a portion of the substrate 100 that is adjacent to the opening 1700P of the protective film base 170, because the thickness of the portion of the substrate 100 that is adjacent to the opening 1700P of the protective film base 170 reduces toward the opening 1700P, the magnitude of the stress occurring at the relevant portion may be greatly reduced. Therefore, exfoliation of the protective film base 170 from the substrate 100 may be effectively prevented or reduced.

To reduce or minimize stress applied to the protective film base 170, the bending area BA may be within the opening 1700P of the protective film base 170 as illustrated in FIG. 5. That is, the area of the opening 1700P of the protective film base 170 is wider than the area of the bending area BA. However, the inventive concept is not limited thereto and the opening 1700P of the protective film base 170 may be within the bending area BA. That is, the area of the bending area BA is wider than the area of the opening 1700P of the protective film base 170.

For reference, although FIG. 5 illustrates that the end of the edge of the substrate 100 in the second region 2A coincides with (e.g., meets and aligns with) the end of the protective film, the inventive concept is not limited thereto. For example, the ends of the protective film base 170 and the adhesive layer 180 may not extend up to the end of the edge of the substrate 100 and may not cover the lower surface beside the end of the edge of the substrate 100. Also, although FIG. 5 illustrates that the cross-sectional surface of the protective film base 170 is approximately perpendicular to the lower surface of the substrate 100, the cross-sectional surface of the protective film base 170 may be inclined by a non-perpendicular angle with respect to the lower surface of the substrate 100.

The buffer layer 110, the gate insulating layer 120, and the interlayer insulating layer 130 including an inorganic material, illustrated in FIGS. 2 to 4, may be collectively referred to as an inorganic insulating layer. The inorganic insulating layer includes an opening corresponding to the bending area BA as illustrated in FIGS. 2 to 4. That is, the buffer layer 110, the gate insulating layer 120, and the interlayer insulating layer 130 may respectively include openings 110a, 120a, and 130a corresponding to the bending area BA. A fact that the opening corresponds to the bending area BA may denote that the opening overlaps the bending area BA. In this case, the area of the opening may be larger than the area of the bending area BA. For this purpose, FIGS. 2 to 4 illustrate that the width OW of the opening is greater than the width of the bending area BA. In this case, the area of the opening may be defined as the area of an opening having a smallest area from among the openings 110a, 120a, and 130a of the buffer layer 110, the gate insulating layer 120, and the interlayer insulating layer 130. FIGS. 2 to 4 illustrate the area of the opening is defined by the area of the opening 110a of the buffer layer 110.

For reference, although FIGS. 2 to 4 illustrate that the inner lateral surface of the opening 110a of the buffer layer 110 coincides with (e.g., is aligned with or matches in slope with) the inner lateral surface of the opening 120a of the gate insulating layer 120, the inventive concept is not limited thereto. For example, the area of the inner lateral surface of the opening 120a of the gate insulating layer 120 may be greater than the area of the inner lateral surface of the opening 110a of the buffer layer 110. Even in this case, the area of the opening may be defined as the area of an opening having a smallest area from among the openings 110a, 120a, and 130a of the buffer layer 110, the gate insulating layer 120, and the interlayer insulating layer 130.

As described herein, when forming the display portion, the organic layer 160 filling at least a portion of the opening of the inorganic insulating layer is formed. FIGS. 2 to 4 illustrate that the organic layer 160 completely fills the opening. Also, the display portion includes the first conductive layer 215c. The first conductive layer 215c extends from the first region 1A to the second region 2A through the bending area BA and is over (e.g., is above and overlapping with) the organic layer 160. The first conductive layer 215c may be over (e.g., be above and overlapping with) the inorganic insulating layer, such as the interlayer insulating layer 130, in a region where there is no organic layer 160. The first conductive layer 215c may include the same or substantially the same material as that of the source electrode 215a or the drain electrode 215b and may be formed concurrently (e.g., simultaneously) with the source electrode 215a or the drain electrode 215b.

As described herein, after the opening 1700P is formed in the protective film base 170 as illustrated in FIG. 4, the display panel is bent in the bending area BA as illustrated in FIG. 5. In this case, during a process in which the substrate 100, and/or the like are bent in the bending area BA, tensile stress may be applied to the first conductive layer 215c, but the display device according to an embodiment may prevent or minimize occurrence of a defect in the first conductive layer 215c during the bending process.

When the inorganic insulating layer, such as the buffer layer 110, the gate insulating layer 120 and/or the interlayer insulating layer 130, does not have an opening in the bending area BA and has a continuous shape ranging from the first region 1A to the second region 2A and the first conductive layer 215c is over (e.g., is above and overlapping with) the inorganic insulating layer, a large tensile force is applied to the first conductive layer 215c during the process in which the substrate 100 and/or the like are bent. Particularly, because the inorganic insulating layer has hardness higher than that of the organic layer, there is a very high probability that a crack and/or the like occur in the inorganic insulating layer in the bending area BA. In the case where a crack occurs in the inorganic insulating layer, a crack and/or the like occur also in the first conductive layer 215c over the inorganic insulating layer and thus a probability that a defect, such as disconnection of the first conductive layer 215c, occurs is very high.

However, in the display device according to an embodiment, the inorganic insulating layer has the opening in the bending area BA as described herein, and a portion of the first conductive layer 215c that corresponds to the bending area BA is over (e.g., is above and overlapping with) the organic layer 160 filling at least a portion of the opening of the inorganic insulating layer. Because the inorganic insulating layer has the opening in the bending area BA, a probability that a crack occurs in the inorganic insulating layer is extremely low and the organic layer 160 includes an organic material and thus a probability that a crack occurs is low. Therefore, the display device according to an embodiment may prevent or minimize occurrence of a crack and/or the like in a portion of the first conductive layer 215c corresponding to the bending area BA and located over the organic layer 160. Because the organic layer 160 has hardness less than that of the inorganic layer, the organic layer 160 may effectively reduce or minimize tensile stress concentrated on the first conductive layer 215c by absorbing the tensile stress generated by the bending of the substrate 100, and/or the like The inorganic insulating layer does not necessarily include an opening. For example, the buffer layer 110 from among the elements of the inorganic insulating layer may be an integral body over (e.g., above or overlapping) the first region 1A, the bending area BA, and the second region 2A. Only the gate insulating layer 120 and the interlayer insulating layer 130 may have the openings 120a and 130a. In this case, the inorganic insulating layer may be understood to have a groove, not an opening, and the herein-described organic layer 160 may fill the groove inside the inorganic insulating layer.

When forming the display portion, second conductive layers 213a and 213b may be formed in addition to the first conductive layer 215c. The second conductive layers 213a and 213b may be formed in the first region 1A or the second region 2A, such that the second conductive layers 213a and 213b are located in a layer different from a layer in which the first conductive layer 215c is located, and the second conductive layers 213a and 213b may be electrically connected to the first conductive layer 215c. FIGS. 2 to 4 illustrate that the second conductive layers 213a and 213b include the same or substantially the same material as that of the gate electrode 213 of the TFT 210 and are formed in the same layer as a layer in which the gate electrode 213 is formed, that is, the second conductive layers 213a and 213b are formed over the gate insulating layer 120. Also, FIGS. 2 to 4 illustrate that the first conductive layer 215c contacts the second conductive layers 213a and 213b via contact holes formed in the interlayer insulating layer 130. In addition, FIGS. 2 to 4 illustrate that the second conductive layer 213a is located in the first region 1A, and the second conducive layer 213b is located in the second region 2A.

The second conductive layer 213a located in the first region 1A may be electrically connected to the TFT and/or the like inside the display area DA, and thus the first conductive layer 215c may be electrically connected to the TFT and/or the like inside the display area DA via the second conductive layer 213a. The second conductive layer 213b located in the second region 2A may be also electrically connected to the TFT and/or the like inside the display area DA via the first conductive layer 215c. As described herein, the second conductive layers 213a and 213b may be electrically connected to elements inside the display area DA while they are located outside the display area DA, and may extend toward the display area DA and at least a portion thereof may be within the display area DA while they are located outside the display area DA.

As described herein, after the opening 1700P is formed in the protective film base 170 as illustrated in FIG. 4, the display panel is bent in the bending area BA as illustrated in FIG. 5. In this case, while the substrate 100 and/or the like are bent in the bending area BA, tensile stress may be applied to elements inside the bending area BA.

Therefore, occurrence of a defect such as a crack in the first conductive layer 215c or disconnection of the first conductive layer 215c may be prevented or reduced by allowing the first conductive layer 215c crossing the bending area BA to include a material having high elongation. Also, efficiency of electric signal transfer may increase in the display device or a defect occurrence rate during the manufacturing process may reduce by forming the second conductive layers 213a and 213b by using a material having elongation lower than that of the first conductive layer 215c but having electrical/physical characteristics different from those of the first conductive layer 215c in the first region 1A or the second region 2A. For example, the second conductive layers 213a and 213b may include Mo, and the first conductive layer 215c may include Al. The first conductive layer 215c or the second conductive layers 213a and 213b may have a multi-layered structure when suitable.

Unlike the embodiments shown in FIGS. 2 to 4, the second conductive layer 213b located in the second region 2A may be electrically connected to various suitable electronic devices, a printed circuit board, and/or the like by allowing at least a portion of the upper surface thereof to not be covered with the planarization layer 140 and/or the like and to be exposed to the outside.

As illustrated in FIGS. 2 to 4, the organic layer 160 may include the irregular surface 160a in at least a portion of the upper surface (e.g., in the +z direction) thereof. Because the organic layer 160 includes the irregular surface 160a, the upper surface and/or the lower surface of the first conductive layer 215c located over the organic layer 160 may have a shape corresponding to the irregular surface 160a of the organic layer 160.

As described herein, when the substrate 100 and/or the like are bent in the bending area BA during the manufacturing process, tensile stress may be applied to the first conductive layer 215c, and the amount of tensile stress applied to the first conductive layer 215c may be reduced or minimized by allowing the upper surface and/or lower surface of the first conductive layer 215c to have a shape corresponding to the irregular surface 160a of the organic layer 160. That is, tensile stress that may occur during a bending process may reduce via deformation of the shape of the organic layer 160 having low strength. In this case, a defect, such as disconnection of the first conductive layer 215c, may be effectively prevented or substantially prevented from occurring by allowing the shape of the first conductive layer 215c (which may be irregular) to be deformed and correspond to the shape of the organic layer 160 deformed by the bending at least before the bending.

Also, the surface area of the upper surface of the organic layer 160 and the surface areas of the upper and lower surfaces of the first conductive layer 215c inside the opening may increase by forming the irregular surface 160a over at least a portion of the upper surface (e.g., in the +z direction) of the organic layer 160. A fact that the surface areas of the upper surface of the organic layer 160 and the upper and lower surfaces of the first conductive layer 215c are wide denotes that a margin by which the organic layer 160 and the first conductive layer 215c may be deformed in order to reduce tensile stress by the bending of the substrate 100 increases.

For reference, because the first conductive layer 215c is over (e.g., is above and overlapping with) the organic layer 160, the lower surface of the first conductive layer 215c has a shape corresponding to the irregular surface 160a of the organic layer 160. However, the upper surface of the first conductive layer 215c may have an irregular surface, for example, may have an irregular surface of an independent shape not corresponding to the irregular surface 160a of the organic layer 160.

The irregular surface 160a of the upper surface (e.g., in the +z direction) of the organic layer 160 may be formed by using various suitable methods. For example, a photoresist material is used when forming the organic layer 160, and a specific portion may be etched (removed) further than other portions by differing the amount of exposure applied to a plurality of portions of the organic layer 160 whose upper surface is approximately planarized via a slit mask or a half-tone mask during a manufacturing process. Here, the further etched portion may be understood as a concave portion in the upper surface of the organic layer 160. The method used when manufacturing the display device according to an embodiment is not limited to the above method. For example, after the organic layer 160 whose upper surface is approximately planarized is formed, only a specific portion may be removed by using dry etching and/or the like or various other suitable methods may be used.

To allow the organic layer 160 to include the irregular surface 160a in the upper surface thereof (e.g., in the +z direction), the organic layer 160 may include a plurality of grooves extending in the first direction (e.g., the +y direction) in the upper surface thereof (e.g., in the +z direction). In this case, the shape of the upper surface of the first conductive layer 215c over the organic layer 160 corresponds to the shape of the upper surface of the organic layer 160.

The organic layer 160 may include the irregular surface 160a only inside the opening of the inorganic insulating layer. FIGS. 2 to 4 illustrate that the width UEW of a portion including the irregular surface 160a of the organic layer 160 is narrower than the width OW of the opening of the inorganic insulating layer. When the organic layer 160 includes the irregular surface 160a inside and outside of the opening of the inorganic insulating layer, the organic layer 160 includes the irregular surface 160a in the neighborhood of the inner surface of the opening 110a of the buffer layer 110, the inner surface of the opening 120a of the gate insulating layer 120, or the inner surface of the opening 130a of the interlayer insulating layer 130. Because a portion of the organic layer 160 corresponding to the concave portion of the irregular surface 160a has a relatively thin thickness as compared to the thickness of a portion of the organic layer 160 that protrudes, when the concave portion is located in the inner surface of the opening 110a of the buffer layer 110, the inner surface of the opening 120a of the gate insulating layer 120, or the inner surface of the opening 130a of the interlayer insulating layer 130, the organic layer 160 may not be continuously connected and may be disconnected. Therefore, it is possible to prevent or substantially prevent the organic layer 160 from being disconnected in the neighborhood of the inner surface of the opening 110a of the buffer layer 110, the inner surface of the opening 120a of the gate insulating layer 120, or the inner surface of the opening 130a of the interlayer insulating layer 130 by allowing the organic layer 160 to include the irregular surface 160a only inside the opening of the inorganic insulating layer.

As described herein, to prevent or reduce disconnection and/or the like of the first conductive layer 215c from occurring in the bending area BA, the organic layer 160 may include the irregular surface 160a in the bending area BA. Therefore, the area of a portion including the irregular surface 160a of the organic layer 160 may be allowed to be wider than the area of the bending area BA and to be narrower than the area of the opening. This is illustrated in FIG. 2 in which the width UEW of the portion including the irregular surface 160a of the organic layer 160 is wider than the width of the bending area BA and narrower than the width OW of the opening.

When at least one of the buffer layer 110, the gate insulating layer 120, and the interlayer insulating layer 130 includes an organic insulating material, the organic layer 160 may be formed concurrently (e.g., simultaneously) when forming a layer including the organic insulating material. Furthermore, the organic layer 160 and the layer including the organic insulating material may be integrally formed. The organic insulating material may include PET, PEN, PC, PI, polyethylene sulfonate, polyoxymethylene, polyallylate, hexamethyldisiloxane, and/or the like.

Most of the elements described with reference to FIGS. 2 to 4 are applicable to embodiments and modifications thereof described below.

Figure 6:
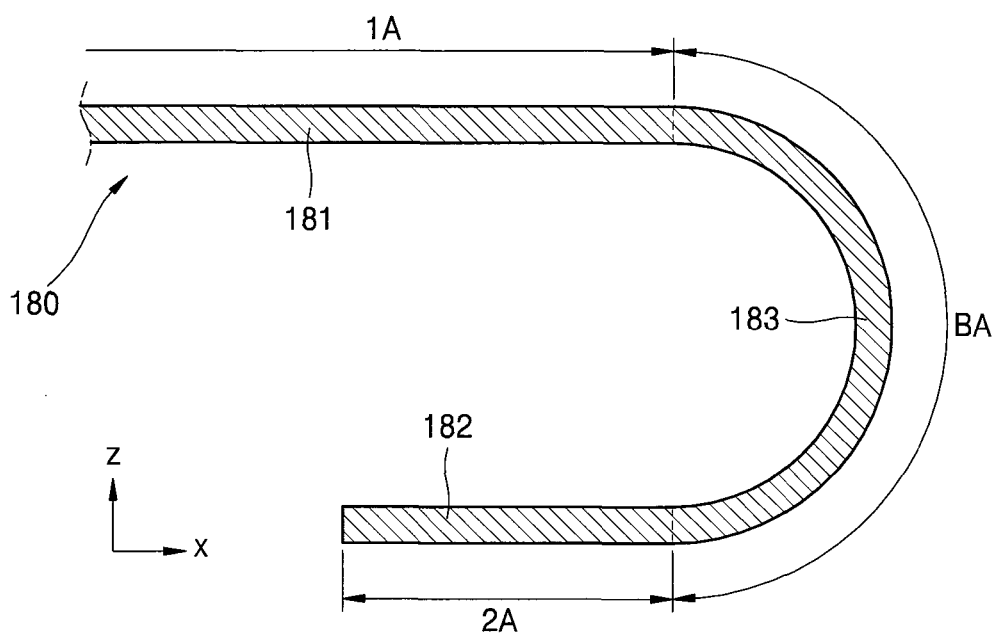

As described herein, the protective film may be attached below the lower surface of the substrate 100. The protective film may include the protective film base 170 and the adhesive layer 180. In this case, as illustrated in FIG. 6 magnifying only the adhesive layer 180, the adhesive layer 180 has an integral shape over the first region 1A, the bending area BA, and the second region 2A even after the opening 1700P is formed in the protective film base 170. Also, a portion of the adhesive layer 180 that corresponds to at least a portion of the bending area BA has hardness different from the hardness of a portion of the adhesive layer 180 that corresponds to at least a portion of the first region 1A. For example, the portion of the adhesive layer 180 that corresponds to at least a portion of the bending area BA has hardness greater than the hardness of the portion of the adhesive layer 180 that corresponds to at least a portion of the first region 1A. FIG. 6 illustrates that the adhesive layer 180 includes a first portion 181 corresponding to the first region 1A, a second portion 182 corresponding to the second region 2A, and a third portion 183 corresponding to the bending area BA. In this case, the third portion 183 has hardness greater than the hardness of the first portion 181.

Figure 7:
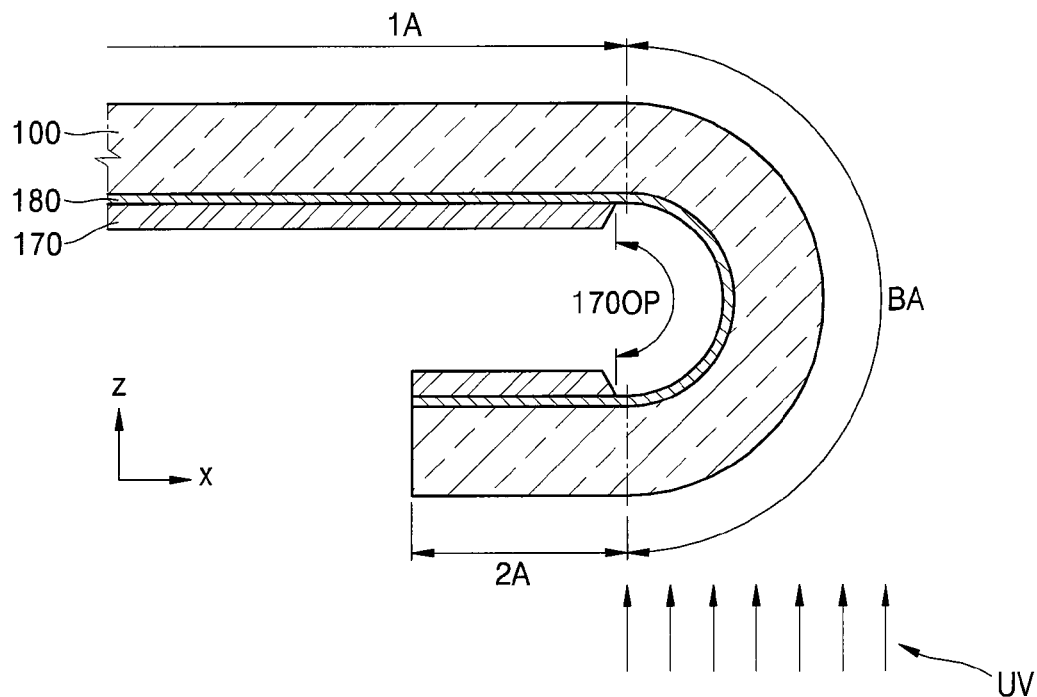

Adjusting the hardness of the adhesive layer 180 may be performed by using various suitable methods. For example, the hardness of the third portion 183 of the adhesive layer 180 may be increased by irradiating an ultraviolet (UV) ray or a laser beam to the relevant portion or applying heat to the relevant portion. That is, after the substrate 100 and/or the like are bent in the bending area BA as illustrated in FIG. 5, the third portion 183 of the adhesive layer 180 may be allowed to have hardness greater than the hardness of the first portion 181 of the adhesive layer 180 by irradiating a UV ray or a laser beam toward the third portion 183 of the adhesive layer 180 or applying heat to the third portion 183 of the adhesive layer 180 as illustrated in FIG. 7. For reference, a general pressure-sensitive adhesive material has increased hardness when a UV ray or a laser beam is irradiated toward or heat is applied thereto. Also, when a UV ray or a laser beam is irradiated toward, or heat is applied to, a portion of the adhesive layer 180 may experience a color change and have a color different from the color of other portions. This is applied to embodiments and modifications thereof described below.

Even when the substrate 100 is bent in the bending area BA as illustrated in FIG. 5, the bent state illustrated in FIG. 5 may not be maintained by a restoring force that restores the substrate 100 to a state before the bending. However, in the display device according to an embodiment, the third portion 183 of the adhesive layer 180 has hardness greater than the hardness of the first portion 181 of the adhesive layer 180 by irradiating the UV ray toward the third portion 183 of the adhesive layer 180 as illustrated in FIG. 7. Because the third portion 183, which is a portion of the adhesive layer 180 that corresponds to the bending area BA, has the increased hardness, deformation of the substrate 100 by the restoring force that restores the substrate 100 to the state before the bending may be effectively prevented or minimized.

To allow the adhesive layer 180 to remain over the first region 1A, the bending area BA, and the second region 2A even after the opening 1700P is formed in the protective film base 170, the adhesive force of a portion of the adhesive layer 180 that corresponds to the bending area BA may be weakened before forming the opening 1700P in the protective film base 170. For example, as illustrated in FIG. 3, before irradiating a laser beam to the portion of the adhesive layer 180 that corresponds to the bending area BA as illustrated in FIG. 3, a portion of the adhesive layer 180 that corresponds to a portion of the protective film base 170 toward which the laser beam is to be irradiated may be allowed to have an adhesive force less than the adhesive force of the other portions by irradiating a UV ray to the relevant portion of the adhesive layer 180. For reference, a general pressure-sensitive adhesive material has a reduced adhesive force when a UV ray is irradiated theretoward.

In this case, when irradiating a laser beam to the portion of the protective film base 170 that corresponds to the bending area BA and removing the portion as illustrated in FIG. 3, the relevant portion of the protective film base 170 may be removed easily and swiftly due to the low adhesive force of the relevant portion of the adhesive layer 180. Also, as a result, the relevant portion of the adhesive layer 180 may not be removed and may remain over the substrate 100. When not only the portion of the protective film base 170 that corresponds to the bending area BA, but also a portion of the protective film base 170 that corresponds to the second region 2A is removed as described below, a portion of the adhesive layer 180 that corresponds to the second region 2A may also be allowed to have a weakened adhesive force.

However, the process of weakening the adhesive force may not be performed. For example, the portion of the adhesive layer 180 that corresponds to the portion of the protective film base 170 to be removed may have a first adhesive material, and a portion of the adhesive layer 180 that corresponds to a portion of the protective film base 170 to remain may have a second adhesive material. In this case, the first adhesive material may have an adhesive force less than the adhesive force of the second adhesive material.

For reference, the intensity of a UV ray irradiated onto the adhesive layer 180 in order to reduce the adhesive force of a specific portion of the adhesive layer 180 is less than the intensity of a UV ray irradiated onto the adhesive layer 180 in order to increase the hardness of a specific portion of the adhesive layer 180. Also, when the adhesive layer 180 has an adhesive force of about 500 gram-force/inch, the adhesive layer 180 may be considered as having a high adhesive force. When the adhesive layer 180 has adhesive force less than about 500 gram-force/inch, the adhesive layer 180 may be considered as having a low adhesive force.

FIG. 6 illustrates that a boundary between the first portion 181 and the third portion 183 of the adhesive layer 180 coincides with (e.g., corresponds to) a boundary between the first region 1A and the bending area BA, and a boundary between the second portion 182 and the third portion 183 of the adhesive layer 180 coincides with (e.g., corresponds to) a boundary between the second region 2A and the bending area BA. However, as understood by a person of ordinary skill in the art, the inventive concept is not limited thereto and various suitable modifications may be made.

Figure 8:
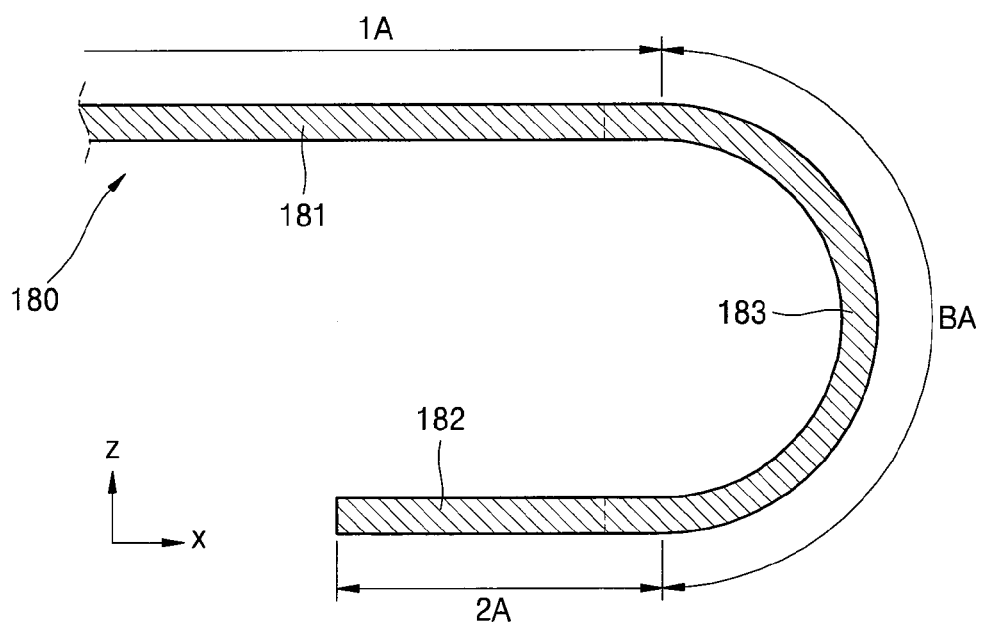
FIG. 8 is a cross-sectional view illustrating a portion of a display device according to an embodiment of the inventive concept.

For example, as illustrated in FIG. 8, which is a cross-sectional view illustrating a portion of a display device according to another embodiment, the third portion 183 of the adhesive layer 180 may have an area greater than the area of the bending area BA. That is, the boundary between the first portion 181 and the third portion 183 of the adhesive layer 180 may be within the first region 1A, and the boundary between the second portion 182 and the third portion 183 of the adhesive layer 180 may be inside the second region 2A. In this case, not only a portion of the adhesive layer 180 that exactly corresponds to the bending area BA but also a portion of the adhesive layer 180 that corresponds to a portion of the first region 1A adjacent to the bending area BA, and a portion of the adhesive layer 180 that corresponds to a portion of the second region 2A adjacent to the bending area BA belong to the third portion 183. Deformation of the substrate 100 by a restoring force that restores the substrate 100 to a state before the bending may be effectively prevented or minimized even more by making the hardness of the third portion 183 greater than the hardness of the first portion 181.

FIG. 7 illustrates that when irradiating a UV ray to the third portion 183 of the adhesive layer 180, the UV ray is irradiated in an upper direction (e.g., in the +z direction) from a light source located in a lower direction (e.g., in the −z direction). However, the inventive concept is not limited thereto and the UV ray may be irradiated in the lower direction (e.g., in the −z direction) from a light source located in the upper direction (e.g., in the +z direction), and the UV ray may be irradiated onto the third portion 183 of the adhesive layer 180 in both the upper and lower directions, simultaneously.

Figure 9:
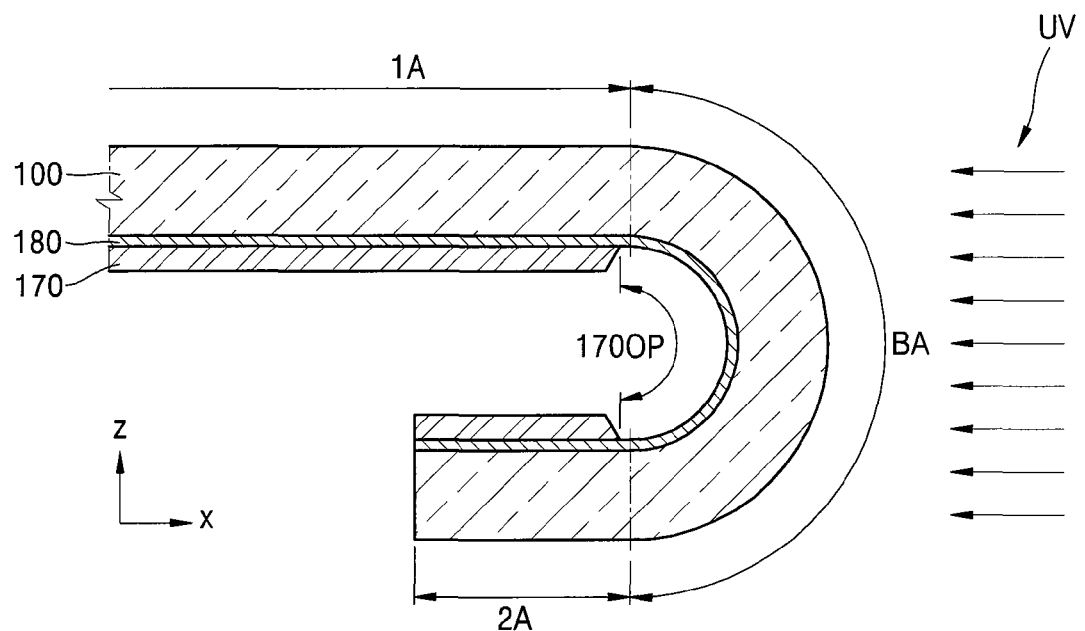
FIG. 9 is a cross-sectional view illustrating a process of manufacturing a display device according to another embodiment of the inventive concept.

Also, as illustrated in FIG. 9, which is a cross-sectional view illustrating a process of manufacturing a display device according to another embodiment, a UV ray may be irradiated in a display panel direction (e.g., in the −x direction) from a light source located in the lateral direction (e.g., in the +x direction) of the display panel. In this case, as illustrated in FIG. 10, the adhesive layer 180 may include a first intermediate portion 181' and a second intermediate portion 182'.

The first intermediate portion 181' denotes a portion of the adhesive layer 180 that is located between the first portion 181 and the third portion 183, and the second intermediate portion 182' denotes a portion of the adhesive layer 180 that is located between the second portion 182 and the third portion 183. The hardness of the adhesive layer 180 may not be constant and may gradually change in the first intermediate portion 181' and the second intermediate portion 182'. For example, in the first intermediate portion 181' and the second intermediate portion 182', hardness reduces toward a direction from the center of the bending area BA to the center of the first region 1A along the adhesive layer 180. Here, the direction from the center of the bending area BA to the center of the first region 1A along the adhesive layer 180 is not limited to a simple straight line direction but may be understood as a direction from the center of the bending area BA to the center of the first region 1A along the surface of the adhesive layer 180 including a curved surface. As understood by a person of ordinary skill in the art, the direction may be understood as a direction (e.g., the −x direction) from the outer portion of the display panel to the center of the display panel in FIG. 10.

In the case where a UV ray is irradiated in a display panel direction (e.g., in the −x direction) from a light source located in the lateral direction (e.g., the +x direction) of the display panel as illustrated in FIG. 9, the amount of exposure at a portion of the first intermediate portion 181' that is adjacent to the bending area BA is larger than the amount of exposure at a portion of the first intermediate portion 181' that is adjacent to the first region 1A. Therefore, the portion of the first intermediate portion 181' that is adjacent to the bending area BA has hardness greater than the hardness of the portion of the first intermediate portion 181' that is adjacent to the first region 1A. As a result, the hardness inside the first intermediate portion 181' may reduce in a direction (e.g., in the −x direction) from the outer portion of the display panel to the center of the display panel. This is equally applicable to the second intermediate portion 182'.

Figure 10:
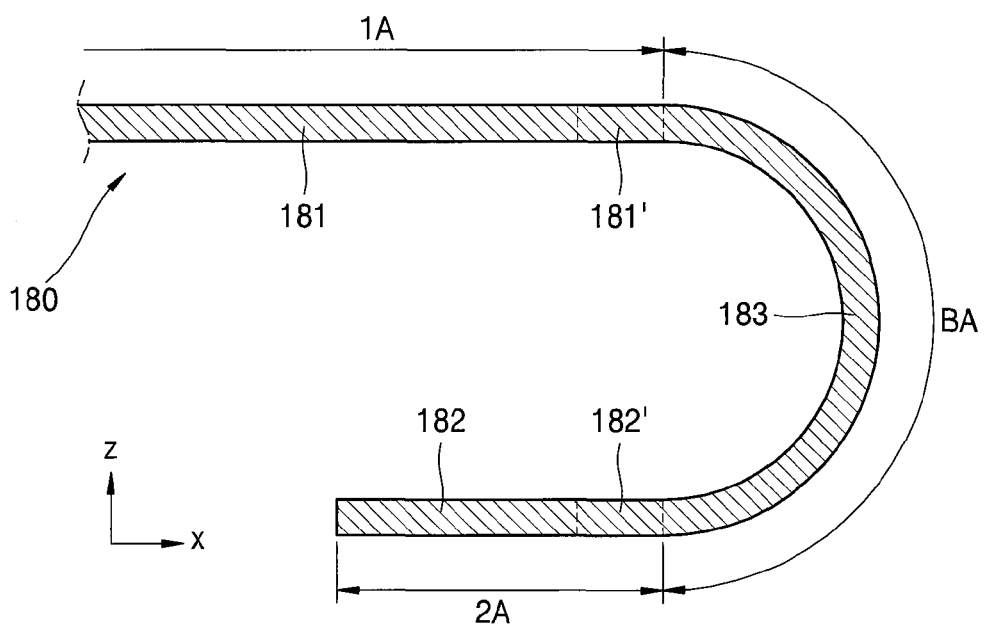
FIG. 10 is a cross-sectional view illustrating a portion of a display device manufactured by the process of FIG. 9.

FIG. 10 illustrates that a boundary between the first intermediate portion 181' of the adhesive layer 180 and the third portion 183 coincides with (e.g., corresponds to) a boundary between the first region 1A and the bending area BA, and a boundary between the second intermediate portion 182' of the adhesive layer 180 and the third portion 183 coincides with (e.g., corresponds to) a boundary between the second region 2A and the bending area BA. However, the inventive concept is not limited thereto.

Figure 11:
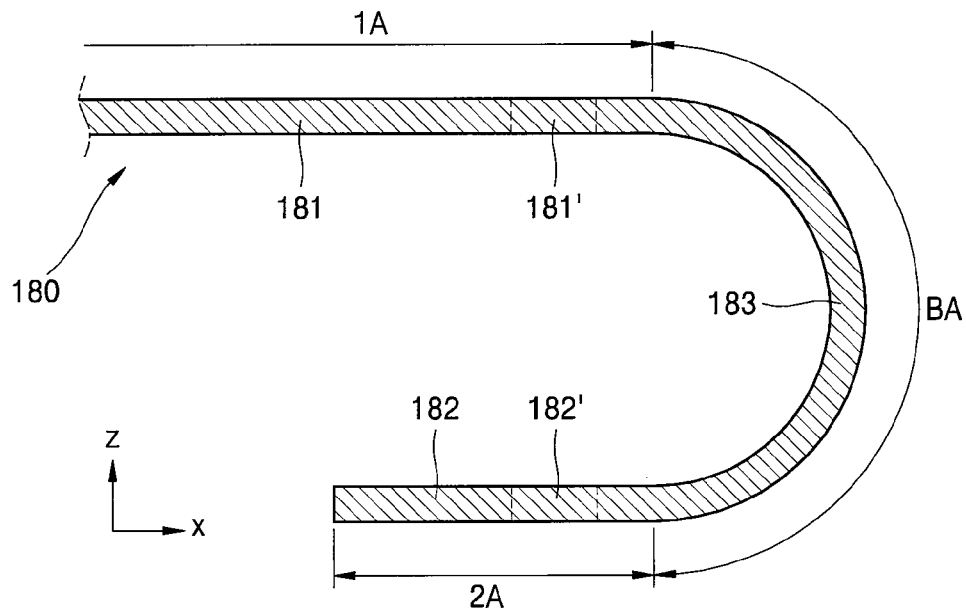
FIG. 11 is a cross-sectional view illustrating a portion of a display device according to another embodiment of the inventive concept.

For example, as illustrated in FIG. 11, which is a cross-sectional view illustrating a portion of a display device according to another embodiment, the third portion 183 of the adhesive layer 180 may have an area greater than the area of the bending area BA. That is, the boundary between the first intermediate portion 181' and the third portion 183 of the adhesive layer 180 may be inside the first region 1A, and the boundary between the second intermediate portion 182' and the third portion 183 of the adhesive layer 180 may be inside the second region 2A. In this case, not only a portion of the adhesive layer 180 that exactly corresponds to the bending area BA but also a portion of the adhesive layer 180 that corresponds to a portion of the first region 1A adjacent to the bending area BA, and a portion of the adhesive layer 180 that corresponds to a portion of the second region 2A adjacent to the bending area BA belong to the third portion 183. Deformation of the substrate 100 by a restoring force that restores the substrate 100 to a state before the bending may be effectively prevented or minimized even more by making the hardness of the third portion 183 greater than the hardness of the first portion 181.

Even when a UV ray is irradiated in the display panel direction (e.g., the −x direction) from a light source located in the lateral direction (e.g., the +x direction) of the display panel as illustrated in FIG. 9, the hardness of the first intermediate portion 181' and the second intermediate portion 182' may not increase like the hardness of the third portion 183 but may be maintained at the same or substantially the same hardness as the hardness of the first portion 181 and the second portion 182. In this case, even though the hardness of the first intermediate portion 181' and the second intermediate portion 182' does not change, an adhesive force thereof may change. That is, when the UV ray is irradiated, the adhesive force of the adhesive layer 180 may reduce and thus the adhesive force of a portion of the first intermediate portion 181' adjacent to the bending area BA, which is relatively close to the light source, may be less than the adhesive force of a portion of the first intermediate portion 181' adjacent to the first region 1A. As a result, the adhesive force inside the first intermediate portion 181' may increase toward a direction (e.g., the −x direction) from the outer portion of the display panel to the center of the display panel. This is equally applicable to the second intermediate portion 182'.

Even in this case, as illustrated in FIG. 11, the third portion 183 of the adhesive layer 180 may have an area greater than the area of the bending area BA. That is, the boundary between the first intermediate portion 181' and the third portion 183 of the adhesive layer 180 may be inside the first region 1A, and the boundary between the second intermediate portion 182' and the third portion 183 of the adhesive layer 180 may be inside the second region 2A. In this case, not only a portion of the adhesive layer 180 that exactly corresponds to the bending area BA but also a portion of the adhesive layer 180 that corresponds to a portion of the first region 1A adjacent to the bending area BA, and a portion of the adhesive layer 180 that corresponds to a portion of the second region 2A adjacent to the bending area BA belong to the third portion 183.

Also, even when a UV ray is irradiated in the display panel direction (e.g., the −x direction) from a light source located in the lateral direction (e.g., the +x direction) of the display panel as illustrated in FIG. 9, the hardness of the first intermediate portion 181' and the second intermediate portion 182' may not increase like the hardness of the third portion 183 but may be maintained at the same or substantially the same hardness as the hardness of the first portion 181 and the second portion 182. In this case, even though the hardness of the first intermediate portion 181' and the second intermediate portion 182' does not change, color thereof may change. That is, the first intermediate portion 181' and the second intermediate portion 182' may have the same or substantially the same hardness as the hardness of the first portion 181 and the second portion 182 and may have a color different from the color of the first portion 181 and the second portion 182. Even in this case, as illustrated in FIG. 11, the third portion 183 of the adhesive layer 180 may have an area greater than the area of the bending area BA.

As a modification of the illustration in FIG. 9, a UV ray may be irradiated onto a portion of the adhesive layer 180 that corresponds to the bending area BA in a display panel direction (e.g., the −y direction) from a light source located in one direction (e.g., the +y direction) of the display panel. A UV ray may be irradiated onto a portion of the adhesive layer 180 that corresponds to the bending area BA in a display panel direction (e.g., the +y direction) from a light source located in the other direction (e.g., the −y direction) of the display panel. UV rays may be simultaneously irradiated onto a portion of the adhesive layer 180 that corresponds to the bending area BA in the display panel direction from light sources located in one direction (e.g., the +y direction) and the other direction (e.g., the −y direction) of the display panel. The characteristic of the adhesive layer 180 in this case is described with reference to the bending area BA and the coordinate axes of FIG. 1 illustrating the substrate 100 having a shape similar to the shape of the bent adhesive layer 180.

When a UV ray is irradiated onto a portion of the adhesive layer 180 that corresponds to the bending area BA in the display panel direction (e.g., the −y direction) from a light located in one direction (e.g., the +y direction) of the display panel and hardens the portion of the adhesive layer 180 that corresponds to the bending area BA, the amount of exposure at a portion in a light source direction (e.g., the +y direction) of the adhesive layer 180 corresponds to the bending area BA is greater than the amount of exposure at a portion in the opposite direction (e.g., the −y direction). Therefore, the portion in the light source direction (e.g., the +y direction) of the adhesive layer 180 may have a hardness greater than the hardness of the portion in the opposite direction (e.g., the −y direction). The adhesive force of the portion in the light source direction (e.g., the +y direction) of the adhesive layer 180 may be less than the adhesive force of the portion in the opposite direction (e.g., the −y direction).

Unlike this, when a UV ray is irradiated onto a portion of the adhesive layer 180 that corresponds to the bending area BA in the display panel direction (e.g., the +y direction) from a light located in one direction (e.g., the −y direction) of the display panel and hardens the portion of the adhesive layer 180 that corresponds to the bending area BA, the amount of exposure at a portion in a light source direction (e.g., the −y direction) of the adhesive layer 180 that corresponds to the bending area BA is greater than the amount of exposure at a portion in the opposite direction (e.g., the +y direction). Therefore, the portion in the light source direction (e.g., the −y direction) of the adhesive layer 180 may have hardness greater than the hardness of the portion in the opposite direction (e.g., the +y direction). The adhesive force of the portion in the light source direction (e.g., the −y direction) of the adhesive layer 180 may be less than the adhesive force of the portion in the opposite direction (e.g., the +y direction).

In some examples, when UV rays are irradiated onto a portion of the adhesive layer 180 that corresponds to the bending area BA in the display panel direction from a light located in one direction (e.g., the +y direction) and the other direction (e.g., the −y direction) of the display panel, simultaneously, the UV rays harden the portion of the adhesive layer 180 that corresponds to the bending area BA. In such a case, the amounts of exposure at portions of both ends, which are light source directions (e.g., the +y direction and the −y direction) of the adhesive layer 180, in the adhesive layer 180 corresponding to the bending area BA, are greater than the amount of exposure at the central portion of the adhesive layer 180 that corresponds to the bending area BA. Therefore, the portions of both ends, which are light source directions (e.g., the +y direction and the −y direction), in the adhesive layer 180, may have hardness greater than the hardness of the central portion of the adhesive layer 180 that corresponds to the bending area BA. The portions of both ends, which are light source directions (e.g., the +y direction and the −y direction), in the adhesive layer 180, may have an adhesive force less than the adhesive force of the central portion of the adhesive layer 180 that corresponds to the bending area BA.

Figure 12:
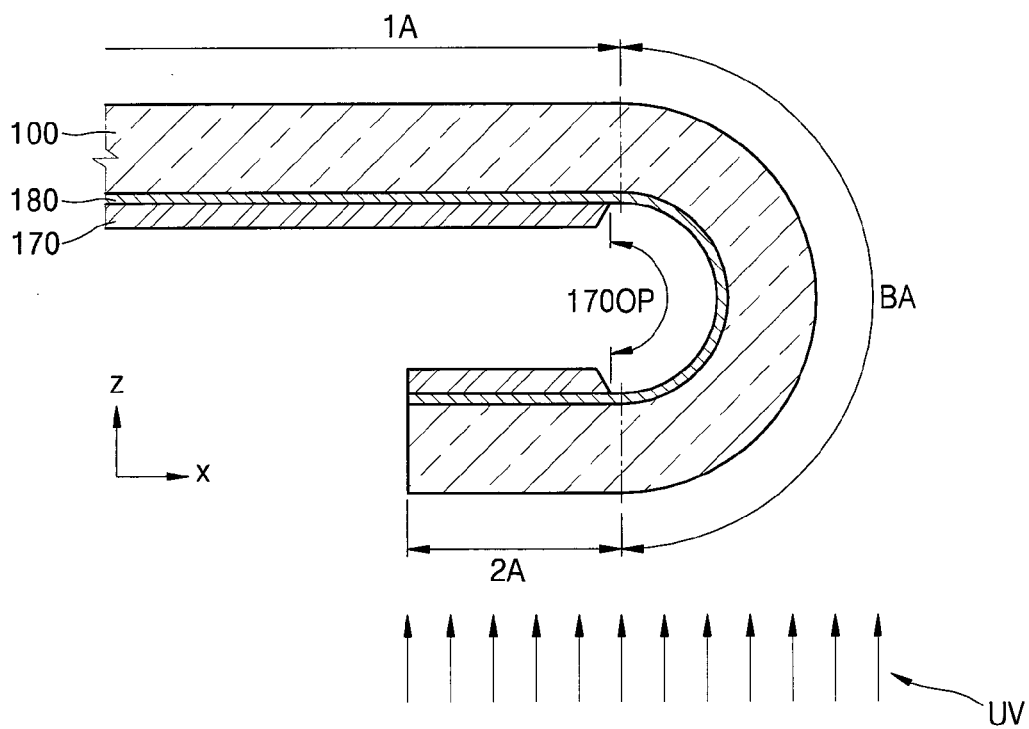
FIG. 12 is a cross-sectional view illustrating a process of manufacturing a display device according to another embodiment of the inventive concept.

FIG. 12 is a cross-sectional view illustrating a process of manufacturing a display device according to another embodiment of the inventive concept. As illustrated in FIG. 12, when irradiating a UV ray toward the adhesive layer 180, the UV ray may be irradiated onto not only the portion of the adhesive layer 180 that corresponds to the bending area BA but also a portion of the adhesive layer 180 that corresponds to the second region 2A. In this case, the portion of the adhesive layer 180 that corresponds to the second area 2A has same or substantially the same hardness as the hardness of the portion of the adhesive layer 180 that corresponds to the bending area BA. Referring to the structure illustrated in FIG. 6, the second portion 182 and the third portion 183 of the adhesive layer 180 have hardness greater than the hardness of the first portion 181 of the adhesive layer 180. Therefore, the mechanical stability of the display panel may improve by increasing the hardness of a portion of the display panel that corresponds to the second area 2A, which may be considered as the edge of the substrate 100, as well as a portion of the display panel that corresponds to the bending area BA of the substrate 100.

Even in this case, as illustrated in FIG. 8, the third portion 183 of the adhesive layer 180 may have an area greater than the area of the bending area BA. That is, a boundary between the first portion 181 and the third portion 183 of the adhesive layer 180 may be inside the first region 1A. Through this structure, deformation of the substrate 100 by a restoring force that restores the substrate 100 to the state before the bending may be effectively prevented or minimized.

FIG. 12 illustrates that when a UV ray is irradiated onto the portion of the adhesive layer 180 that corresponds to the second region 2A and the bending area BA, the UV is irradiated in an upper direction (e.g., the +z direction) from a light source located in a lower direction (e.g., the −z direction). However, the inventive concept is not limited thereto. For example, as illustrated in FIG. 9, the UV ray may be irradiated in the display panel direction (e.g., the −x direction) from a light source located in the lateral direction (e.g., the +x direction) of the display panel. In this case, the first region 1A of the adhesive layer 180 may include a portion having decreasing hardness or increasing adhesive force toward a direction from the center of the bending area BA to the center of the first region 1A along the adhesive layer 180.

Figure 13:
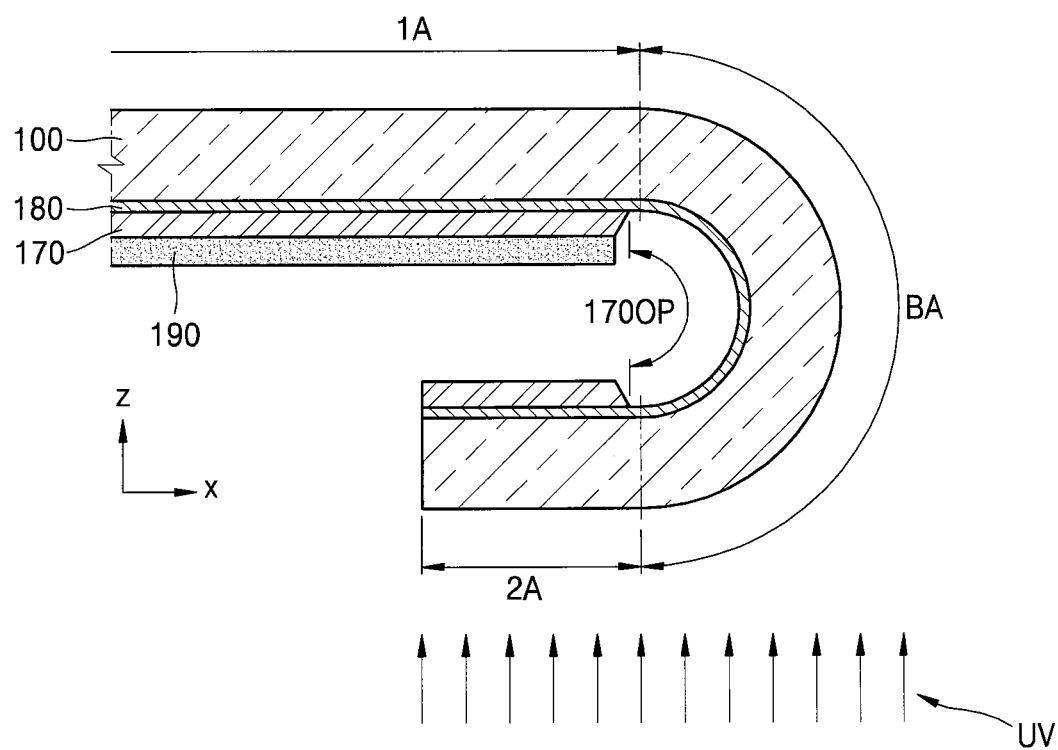
FIG. 13 is a cross-sectional view illustrating a process of manufacturing a display device according to another embodiment of the inventive concept.

During a process of irradiating a UV ray in order to increase the hardness of the portion of the adhesive layer 180 that corresponds to the bending area BA, the UV ray may be irradiated onto the OLED 300 in the display area DA and thus cause damage to the OLED 300. Therefore, to prevent or substantially prevent this problem from occurring, a display device according to another embodiment may further include a light-shielding layer 190 as illustrated in FIG. 13. The light-shielding layer 190 may be below a portion (e.g., the −z direction) of the protective film base 170 that corresponds to the display portion to correspond to at least a portion of the display portion.

When the light-shielding layer 190 exists as described herein, when irradiating a UV ray to the portion of the adhesive layer 180 that corresponds to the bending area BA and the second region 2A as illustrated in FIG. 13, the OLED 300 and/or the like of the display portion may be effectively prevented or substantially prevented from being influenced by the UV ray. Unlike the illustration in FIG. 13, and similar to the illustration in FIG. 7, even when irradiating a UV ray toward the portion of the adhesive layer 180 that corresponds to the bending area BA, the light-shielding layer 190 may effectively prevent or substantially prevent the OLED 300 and/or the like of the display portion from being influenced by the UV ray. The light-shielding layer 190 includes a material that may block the UV ray and may include, for example, an organic material such as benzophenone and an inorganic material such as titanium dioxide, zinc oxide, and/or the like.

The light-shielding layer 190 may be below (e.g., the −z direction) the protective film base 170 in the form of a film as illustrated in FIG. 13, and may contact both a portion of the protective film base 170 that corresponds to the first region 1A and a portion of the protective film base 170 that corresponds to the second region 2A. In the latter case, the light-shielding layer 190 may also serve as a support body supporting the display panel.

Figure 14:
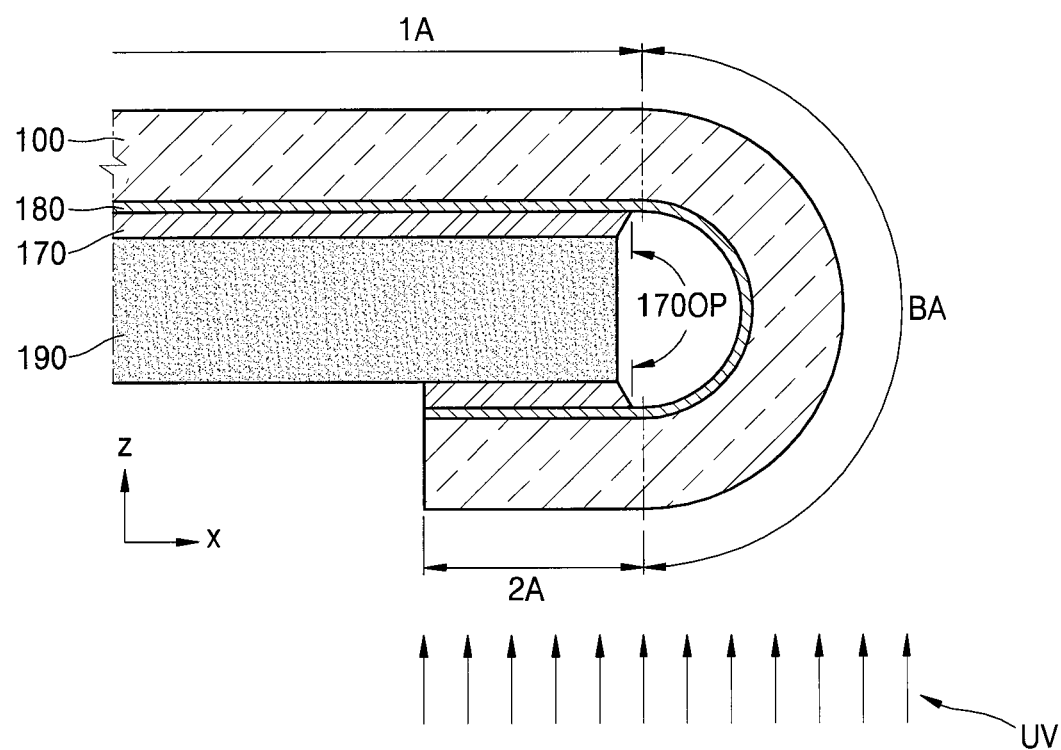
FIG. 14 is a cross-sectional view illustrating a process of manufacturing a display device according to another embodiment of the inventive concept.

A support layer having the shape of the light-shielding layer 190 illustrated in FIG. 14, not having a light-shielding function, but having a simple support function may replace the light-shielding layer 190 in FIG. 14. The support layer may be a cushion layer having elasticity.

Figure 15:
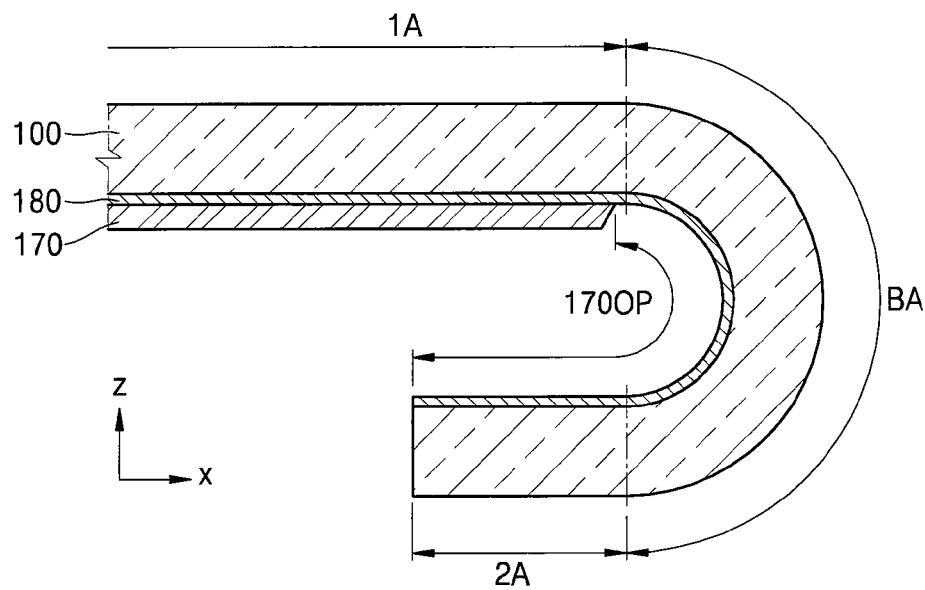
FIG. 15 is a cross-sectional view illustrating a portion of a display device according to another embodiment of the inventive concept.

Up to now, although the protective film base 170 has been described to have the opening 1700P corresponding to the bending region BA and to be attached below portions of the substrate 100 that correspond to the first region 1A and the second region 2A, the inventive concept is not limited thereto. For example, the protective film base 170 may correspond to only at least a portion of the first region 1A of the substrate 100. That is, as illustrated in FIG. 15, which is a cross-sectional view illustrating a display device according to another embodiment, the protective film base 170 may not exist in the second region 2A of the substrate 100.

For example, when removing a portion of the protective film base 170 by irradiating a laser beam toward the portion of the protective film base 170 as illustrated in FIG. 3, the laser beam may be irradiated onto not only a portion of the protective film base 170 that corresponds to the bending area BA but also a portion of the protective film base 170 that corresponds to the second region 2A, thus only the adhesive layer 180 may remain in the bending area BA and the second region 2A. After that, when the substrate 100 and/or the like are bent in the bending area BA, the structure illustrated in FIG. 15 is obtained.

Even the display device according to the present embodiment may have the structure described with reference to FIGS. 6, 8, 10, and 11. Even in this case, the hardness of a portion of the adhesive layer 180 may be made greater than the hardness of the other portion by irradiating a UV ray toward various suitable ranges in various suitable directions as described with reference to FIGS. 7, 9, and 12.

Figure 16:
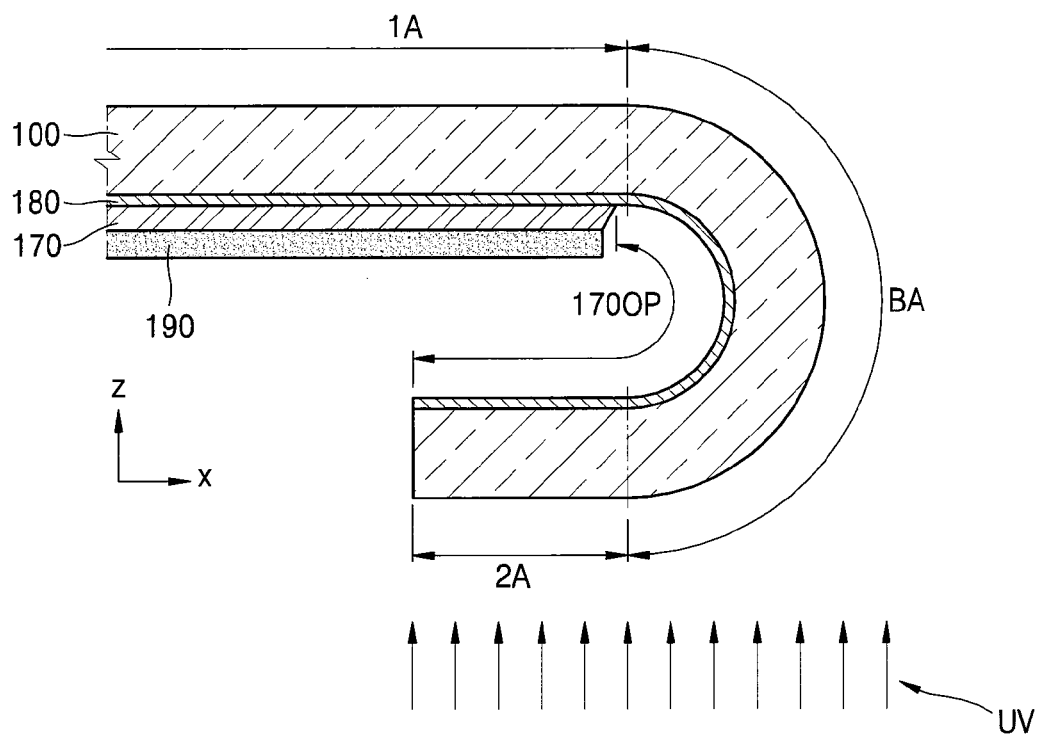
FIG. 16 is a cross-sectional view illustrating a process of manufacturing a display device according to another embodiment of the inventive concept.

Also, as illustrated in FIG. 16, even in a circumstance where the protective film base 170 corresponds to at least a portion of the first region 1A of the substrate 100, the display device may further include the light-shielding layer 190. The light-shielding layer 190 may be below a portion (e.g., the −z direction) of the protective film base 170 that corresponds to the display portion to correspond to at least a portion of the display portion. The light-shielding layer 190 may be below (e.g., the −z direction) the protective film base 170 in the form of a film as illustrated in FIG. 16, and may contact both a portion of the protective film base 170 that corresponds to the first region 1A and a portion of the adhesive layer 180 that corresponds to the second region 2A. In the latter case, the light-shielding layer 190 may also serve as a support body supporting the display panel.

Figure 17:
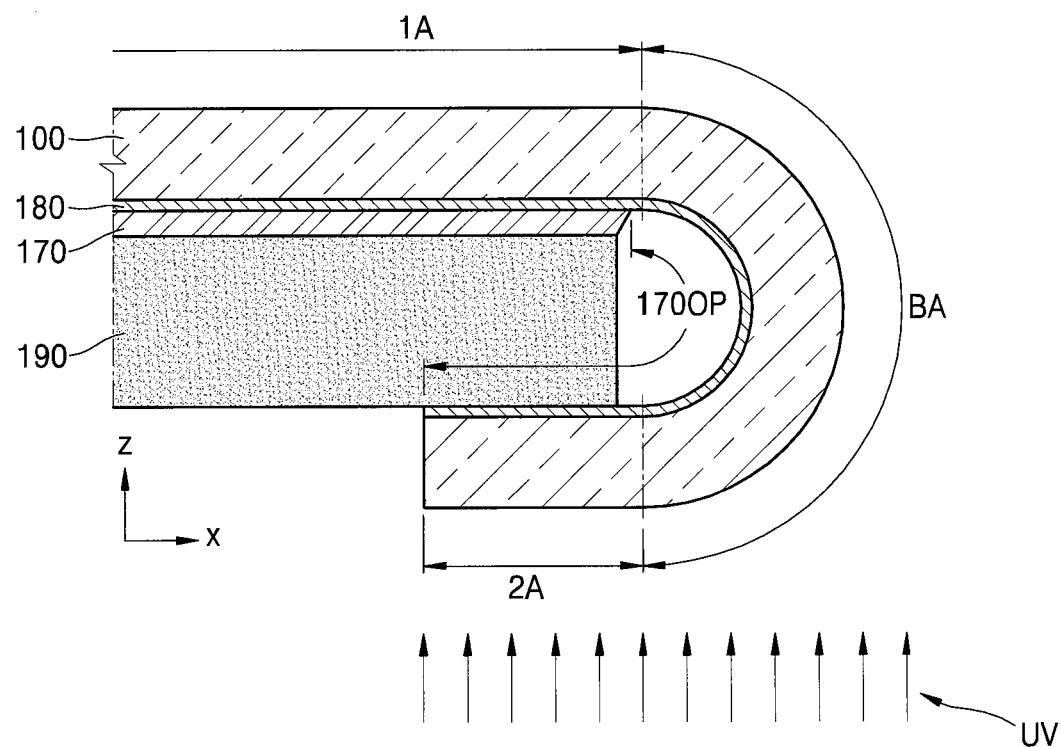
FIG. 17 is a cross-sectional view illustrating a process of manufacturing a display device according to another embodiment of the inventive concept.

Up to now, although description has been made to the case where the UV ray is used in order to make the hardness of a portion of the adhesive layer 180 greater than the hardness of the other portion, the inventive concept is not limited thereto. For example, a specific portion of the adhesive layer 180 may be allowed to have a hardness greater than the hardness of the other portion by applying heat on the relevant portion of the adhesive layer 180. In this case, the light source described with reference to FIGS. 14, 16, and 17 may be replaced by a heat source, and the irradiation direction of the UV ray in the relevant drawings and relevant descriptions may be understood as an application direction of heat.

Also, in the case where a specific portion of the adhesive layer 180 is allowed to have a hardness greater than the hardness of the other portion by applying heat on the relevant portion of the adhesive layer 180, the light-shielding layer 190 in FIGS. 13, 14, 16, 17, and related descriptions may be understood as a heat-insulating layer. The heat-insulating layer may prevent or minimize transfer of heat to the OLED 300, and/or the like, thereby preventing or substantially preventing the OLED 300, and/or the like from being damaged by the heat during a process of increasing the hardness of the specific portion of the adhesive layer 180. As the heat-insulating layer, a porous polymer layer, a porous inorganic layer, and/or the like may be used, for example.

Up to now, although description has been made to the case where the hardness or the adhesive force of a portion of the adhesive layer 180 is changed by irradiating a UV ray or a laser beam toward, or applying heat to, the relevant portion of the adhesive layer 180, the inventive concept is not limited thereto. For example, the physical or chemical properties of a portion of the adhesive layer 180 may differ from the physical or chemical properties of the other portion by irradiating a UV ray or a laser beam toward, or applying heat to, the relevant portion of the adhesive layer 180.

Also, although FIGS. 1, 5 to 13, 15, and 16 illustrate that the substrate 100 is bent around the bending axis such that a portion of the lower surface of the first region 1A faces at least a portion of the lower surface of the second region 2A, the inventive concept is not limited thereto. For example, even though the curvature of the bending area BA is small as compared to the illustration in the drawings or the curvature of the bending area BA does not change drastically, the area of the bending area BA may be narrow and thus the lower surface of the second area 2A may not face the lower surface of the first region 1A, and various suitable modifications may be made as understood by a person of ordinary skill in the art.

Figure 18:
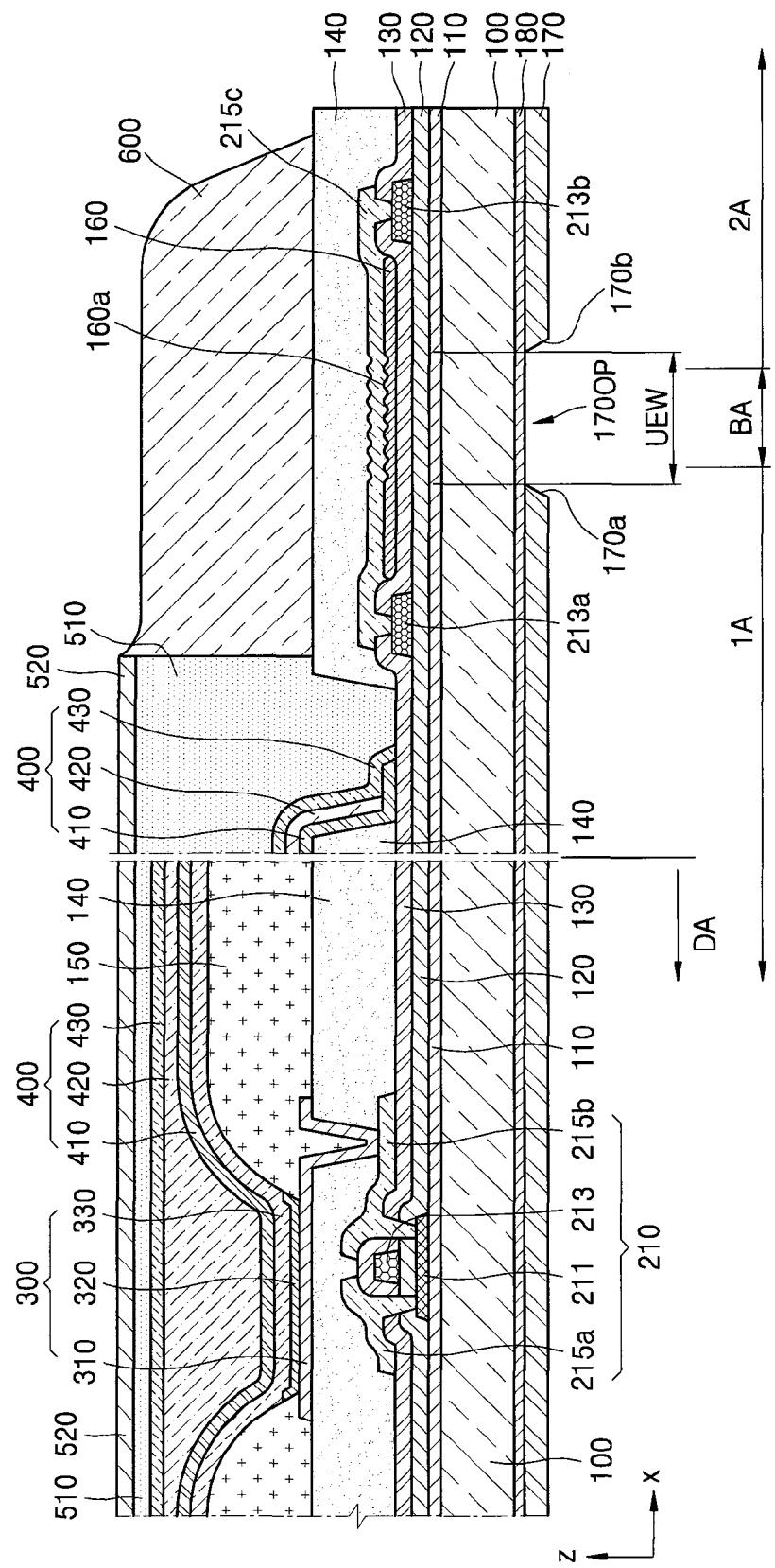
FIG. 18 is a cross-sectional view illustrating a portion of a display device according to another embodiment of the inventive concept.
Figure 19:
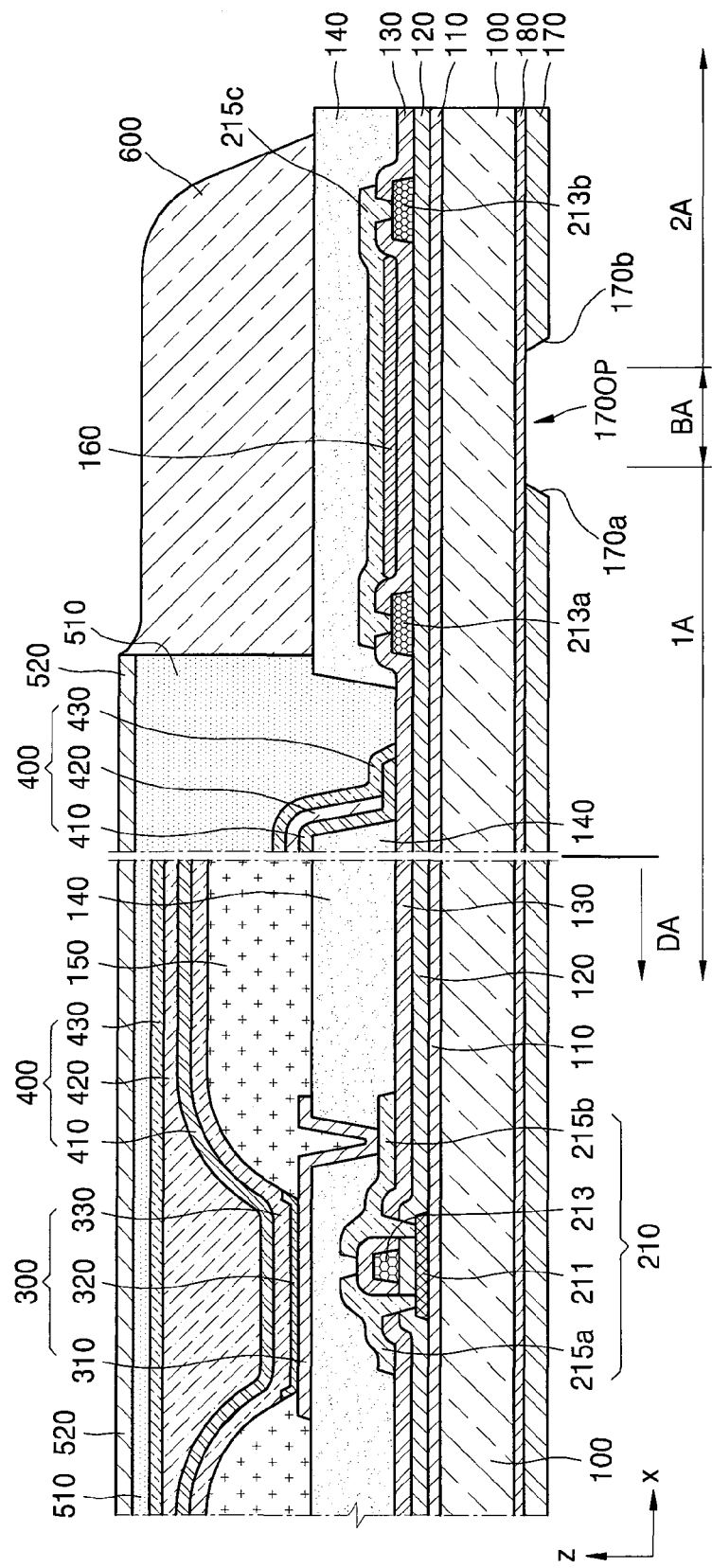
FIG. 19 is a cross-sectional view illustrating a portion of a display device according to another embodiment of the inventive concept.

Although FIGS. 2 to 4 illustrate that the inorganic insulating layer of the display panel includes the opening corresponding to the bending area BA, the inventive concept is not limited thereto. For example, as illustrated in FIG. 18 illustrating a portion of a display device according to another embodiment, the buffer layer 110, the gate insulating layer 120, and the interlayer insulating layer 130 may be continuous over the first region 1A, the bending area BA, and the second region 2A. Also, the organic layer 160 may be over (e.g., be above and overlapping with) the substrate 100, for example, over the interlayer insulating layer 130, and may include the irregular surface 160a in the upper surface thereof corresponding to at least the bending area BA. The structures or characteristics described in the above-described embodiments in relation to the protective film including the protective film base 170 and the adhesive layer 180 are directly applicable to even the display device according to the present embodiment.

Furthermore, as illustrated in FIG. 18 illustrating a portion of a display device according to another embodiment, the structures or characteristics described in the above embodiments in relation to the protective film including the protective film base 170 and the adhesive layer 180 are directly applicable to even the case where the organic layer 160 does not include the irregular surface 160a in the upper surface thereof. Also, the structures or characteristics described in the above embodiments in relation to the protective film including the protective film base 170 and the adhesive layer 180 are directly applicable to even the case where there is no organic layer 160, as understood by a person of ordinary skill in the art.

It will be understood that, although the terms "first", "second", "third", etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section discussed below could be termed a second element, component, region, layer or section, without departing from the spirit and scope of the inventive concept. Also, sizes of components in the drawings may be exaggerated for convenience of explanation. In other words, because sizes and thicknesses of components in the drawings are arbitrarily illustrated for convenience of explanation, the following embodiments are not limited thereto.

It will be understood that when a component, such as a layer, a film, a region, or a plate, is referred to as being "over" another component, the component can be directly on the other component or intervening components may be present thereon.

Spatially relative terms, such as "beneath", "below", "lower", "under", "above", "upper" and the like, may be used herein for ease of description to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. In addition, it will also be understood that when a layer is referred to as being "between" two layers, it can be the only layer between the two layers, or one or more intervening layers may also be present.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept." Also, the term "exemplary" is intended to refer to an example or illustration.

It will be understood that when an element or layer is referred to as being "on", "connected to", "coupled to", or "adjacent" another element or layer, it can be directly on, connected to, coupled to, or adjacent the other element or layer, or one or more intervening elements or layers may be present. When an element or layer is referred to as being "directly on," "directly connected to", "directly coupled to", or "immediately adjacent" another element or layer, there are no intervening elements or layers present.

As used herein, the term "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

The display device and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the display device may be formed on one integrated circuit (IC) chip or on separate IC chips. Further, the various components of the display device may be implemented on a flexible printed circuit film, a tape carrier package (TCP), a printed circuit board (PCB), or formed on a same substrate. Further, the various components of the display device may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

Although the inventive concept has been described with reference to the embodiments illustrated in the drawings, this is merely exemplary and it will be understood by those of ordinary skill in the art that various suitable changes in form and details and equivalents thereof may be made therein without departing from the spirit and scope of the inventive concept as defined by the following claims, and equivalents thereof.

What is claimed is:

1. A display device comprising:
   a substrate comprising a bending area between a first region and a second region and configured to be bent at the bending area;
   a display portion above the substrate in the first region;
   a protective film below the substrate and comprising a protective film base and an adhesive layer,
   wherein the protective film base has an opening corresponding to the bending area or the protective film base corresponds to at least a portion of the first region, and
   wherein the adhesive layer is between the substrate and the protective film base and forms an integral body above the first region, the bending area, and the second region, and at least a portion of the adhesive layer that corresponds to the bending area has a hardness different from that of at least a portion of the adhesive layer corresponding to the first region.

2. The display device of claim 1, wherein the at least a portion of the adhesive layer that corresponds to the bending area has greater hardness than that of the at least a portion of the adhesive layer corresponding to the first region.

3. The display device of claim 2, wherein the adhesive layer comprises a portion having decreasing hardness or a portion having increasing adhesive force in a direction from a center of the bending area to a center of the first region along the adhesive layer.

4. The display device of claim 1, wherein a portion of the adhesive layer corresponding to the second region has a same hardness as that of a portion of the adhesive layer corresponding to the bending area.

5. The display device of claim 4, wherein a portion of the adhesive layer corresponding to the bending area and the second region has greater hardness than that of the at least a portion of the adhesive layer corresponding to the first region.

6. The display device of claim 5, wherein the adhesive layer comprises a portion having decreasing hardness or a portion having increasing adhesive force in a direction from a center of the bending area to a center of the first region along the adhesive layer.

7. The display device of claim 1, further comprising a light-shielding layer below a portion of the protective film base corresponding to the display portion, the light-shielding layer corresponding to at least a portion of the display portion.

8. The display device of claim 7, wherein the light-shielding layer is configured to shield against ultraviolet rays.

9. The display device of claim 7, wherein the substrate is configured to be bent such that a portion of a lower surface thereof in the first region faces at least a portion of a lower surface thereof in the second region,
- wherein the protective film base corresponds to the first and second regions and has an opening corresponding to the bending area, and
- wherein the light-shielding layer contacts both a portion of the protective film base corresponding to the first region and a portion of the protective film base corresponding to the second region.

10. The display device of claim 7, wherein the substrate is configured to be bent such that a portion of a lower surface thereof in the first region faces at least a portion of a lower surface thereof in the second region,
- wherein the protective film base is below the substrate corresponding to at least a portion of the first region, and
- wherein the light-shielding layer contacts a portion of the protective film base corresponding to the first region and a portion of the adhesive layer corresponding to the second region.

11. The display device of claim 1, further comprising a heat-insulating layer below a portion of the protective film base corresponding to the display portion, the heat-insulating layer corresponding to at least a portion of the display portion.

12. The display device of claim 11, wherein the substrate is configured to be bent such that a portion of a lower surface thereof in the first region faces at least a portion of a lower surface thereof in the second region,
- wherein the protective film base corresponds to the first and second regions and has an opening corresponding to the bending area, and
- wherein the heat-insulating layer contacts both a portion of the protective film base corresponding to the first region and a portion of the protective film base corresponding to the second region.

13. The display device of claim 11, wherein the substrate is configured to be bent such that a portion of a lower surface thereof in the first region faces at least a portion of a lower surface thereof in the second region,
- wherein the protective film base is below a portion of the substrate to correspond to at least a portion of the first region, and
- wherein the heat-insulating layer contacts a portion of the protective film base corresponding to the first region and a portion of the adhesive layer corresponding to the second region.

14. A display device comprising:
- a substrate comprising a first region, a second region, and a bending region between the first region and the second region, the substrate being bent at the bending region and configured to support a display portion above the first region; and
- a protective film below the substrate and comprising a protective film base covering at least a portion of the first region, and further comprising an adhesive layer covering the bending region and the first and second regions, a first portion of the adhesive layer corresponding to the first region having a hardness different from that of a second portion of the adhesive layer corresponding to the bending region.

15. The display device of claim 14, wherein the protective film base covers a portion of the second region facing the first region, when the substrate is bent, and does not cover the bending region.

16. The display device of claim 15, wherein the adhesive layer is locally hardened through exposure to UV radiation or application of heat, and
- wherein, as a result of the exposure to UV radiation or the application of heat, the second portion of the adhesive layer has a greater hardness than that of the first portion of the adhesive layer and a third portion of the adhesive layer corresponding to the second region.

17. The display device of claim 15, further comprising a heat-insulating layer covering a portion of the protective film base corresponding to the first region and the second region.

18. The display device of claim 14, further comprising a light-shielding layer covering a portion of the protective film base corresponding to the first region, the light-shielding layer being configured to reduce exposure to UV radiation at a first portion of the adhesive layer relative to the second portion of the adhesive layer.

19. The display device of claim 14, wherein the second portion of the adhesive layer has a greater hardness than that of the first portion of the adhesive layer.

20. The display device of claim 19, wherein the second portion of the adhesive layer has a same hardness as that of a third portion of the adhesive layer corresponding to the second region.

21. The display device of claim 14, wherein a color of the second portion of the adhesive layer is different from that of the first portion of the adhesive layer.

* * * * *